United States Patent
Yeo et al.

(10) Patent No.: US 11,410,996 B2
(45) Date of Patent: Aug. 9, 2022

(54) FIELD-EFFECT TRANSISTORS HAVING TRANSITION METAL DICHALCOGENIDE CHANNELS AND METHODS OF MANUFACTURE

(71) Applicant: Taiwan Semiconductor Manufacturing Company, Ltd., Hsinchu (TW)

(72) Inventors: Yee-Chia Yeo, Hsinchu (TW); Ling-Yen Yeh, Hsinchu (TW); Yuan-Chen Sun, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/569,442

(22) Filed: Sep. 12, 2019

(65) Prior Publication Data
US 2020/0006337 A1    Jan. 2, 2020

Related U.S. Application Data

(62) Division of application No. 16/047,974, filed on Jul. 27, 2018, now Pat. No. 11,164,864, which is a
(Continued)

(51) Int. Cl.
*H01L 29/66* (2006.01)
*H01L 27/088* (2006.01)
(Continued)

(52) U.S. Cl.
CPC .... *H01L 27/0886* (2013.01); *H01L 21/02568* (2013.01); *H01L 21/02614* (2013.01);
(Continued)

(58) Field of Classification Search
CPC .................................................. H01L 29/66969
(Continued)

(56) References Cited

U.S. PATENT DOCUMENTS

| 6,762,802 B2 | 7/2004 | Ono et al. |
| 7,411,209 B2 | 8/2008 | Endo et al. |

(Continued)

FOREIGN PATENT DOCUMENTS

| KR | 101381169 B1 | 4/2014 |
| KR | 20140072789 A1 | 6/2014 |

(Continued)

OTHER PUBLICATIONS

Amara et al., "Wet Chemical Thinning of Molybdenum Disulfide Down to its Monolayer," APL Materials vol. 2, 092509 (2014); doi: 10.1063/1.4893962, Received Jul. 14, 2014, 8 pages.

(Continued)

*Primary Examiner* — Hsin Yi Hsieh
(74) *Attorney, Agent, or Firm* — Slater Matsil, LLP

(57) ABSTRACT

A transistor that is formed with a transition metal dichalcogenide material is provided. The transition metal dichalcogenide material is formed using a direct deposition process and patterned into one or more fins. A gate dielectric and a gate electrode are formed over the one or more fins. Alternatively, the transition metal dichalcogenide material may be formed using a deposition of a non-transition metal dichalcogenide material followed by a treatment to form a transition metal dichalcogenide material. Additionally, fins that utilized the transition metal dichalcogenide material may be formed with sidewalls that are either perpendicular to a substrate or else are sloped relative to the substrate.

20 Claims, 29 Drawing Sheets

Related U.S. Application Data division of application No. 15/001,909, filed on Jan. 20, 2016, now Pat. No. 10,269,791.

(60) Provisional application No. 62/133,813, filed on Mar. 16, 2015.

(51) Int. Cl.
| | |
|---|---|
| *H01L 21/02* | (2006.01) |
| *H01L 29/24* | (2006.01) |
| *H01L 21/8256* | (2006.01) |
| *H01L 29/78* | (2006.01) |

(52) U.S. Cl.
CPC .... *H01L 21/02658* (2013.01); *H01L 21/8256* (2013.01); *H01L 29/24* (2013.01); *H01L 29/66795* (2013.01); *H01L 29/66969* (2013.01); *H01L 29/785* (2013.01)

(58) Field of Classification Search
USPC .......................................................... 257/401
See application file for complete search history.

(56) References Cited

U.S. PATENT DOCUMENTS

| | | | |
|---|---|---|---|
| 8,716,156 | B1 | 5/2014 | Pawlak et al. |
| 9,859,115 | B2 * | 1/2018 | Lin ................... H01L 21/02499 |
| 10,309,027 | B2 * | 6/2019 | Cullen ................... C01G 31/02 |
| 2002/0171085 | A1 | 11/2002 | Suzawa et al. |
| 2013/0270638 | A1 | 10/2013 | Adam et al. |
| 2014/0197459 | A1 | 7/2014 | Kis et al. |
| 2014/0245946 | A1 | 9/2014 | Kong et al. |
| 2014/0353166 | A1 | 12/2014 | Iezzi et al. |
| 2015/0001468 | A1 | 1/2015 | Huang et al. |
| 2015/0064471 | A1 | 3/2015 | Dresselhaus et al. |
| 2015/0303299 | A1 | 10/2015 | Chang et al. |
| 2016/0047059 | A1 | 2/2016 | Kim et al. |
| 2016/0093689 | A1 | 3/2016 | George et al. |
| 2016/0190244 | A1 * | 6/2016 | Lee ................... H01L 29/66742 257/29 |
| 2016/0284811 | A1 | 9/2016 | Yu et al. |
| 2016/0380102 | A1 * | 12/2016 | Patel ................... H01L 21/2253 257/190 |

FOREIGN PATENT DOCUMENTS

| | | | |
|---|---|---|---|
| KR | 20140099212 | A | 8/2014 |
| KR | 101465211 | B1 | 11/2014 |

OTHER PUBLICATIONS

Chang et al., Ballistic performance comparison of monolayer transition metal dichalcogenide MX2 (M=Mo, W; X=S, Se, Te) MOSFETs, J. Applied Physics, vol. 115, 084506, Jan. 1, 2014, 22 pages.

Fathipour et al., "Exfoliated MoTe2 Field-Effect Transistor," Device Research Conference, Jun. 23-26, 2013, pp. 115-116.

Fischl et al., "Molybdenum etching with chlorine atoms and molecular chlorine plasmas," Journal of Vacuum Science & Technology B, vol. 6, 1577 (1988); doi: 10.1116/1.584218, Received Feb. 8, 1988, 5 pages.

Hwang et al., "First Demonstration of Two-Dimensional WS2 Transistors Exhibiting 105 Room Temperature Modulation and Ambipolar Behavior," Device Research Conference, Jun. 18-20, 2012, pp. 187-188.

Kedzierski et al., "A 20 nm gate-length ultra-thin body p-MOSFET with silicide source/drain," Superlattices and Microstructures, vol. 28, No. 5/6, Received Aug. 9, 2000, pp. 445-452.

Khan et al., "Anomalous electron transport in back-gated field-effect transistors with TiTe2 semimetal thin-film channels," Applied Physics Letters, vol. 100, 043109, Jan. 26, 2012, 4 pages.

Kim et al. "High-mobility and low-power thin-film transistors based on multilayer MoS2 crystals," Nature Communications, vol. 3, Art. No. 1011, Aug. 21, 2012, 9 pages.

Kong, et al., "Synthesis of MoS2 and MoSe2 Filims with Vertically Aligned Layers," ACS Publications, dx.doi.org/10.1021/nl400258t, Nano Letters 2013, 1341-1347, Received Jan. 21, 2013, 7 pages.

Kuo et al., "Slope control of molybdenum lines etched with reactive ion etching," Journal of Vacuum Science & Technology A vol. 8, No. 3, 1529 (1990); doi: 10.1116/1.576869, Received Aug. 21, 1989, 5 pages.

Ling et al., "Role of the Seeding Promoter in MoS2 Growth by Chemical Vapor Deposition," ACS Publications, dx.doi.org/10.1021/nl4033704, Nano Letters, 2014, 14, Received Sep. 9, 2013, pp. 464-472.

Liow et al., "Germanium Source and Drain Stressors for Ultrathin-Body and Nanowire Field-Effect Transistors," IEEE Electron Device Letters, vol. 29, No. 7, Jul. 2008, pp. 808-810.

Liu et al., "Layer-by-Layer Thinning of MoS2 by Plasma," ACS Nano, vol. 7, No. 5 (2013), 10.1021/nn400644t, Received Feb. 6, 2013, pp. 4202-4209.

Low et al., "Impact of Surface Roughness on Silicon and Germanium Ultra-Thin-Body MOSFETs," IEEE International Electron Device Meeting, Dec. 13-15, 2004, 4 pages.

Poljak et al., "Assessment of Electron Mobility in Ultra-Thin Body InGaAs-on-Insulator MOSFETs Using Physics-Based Modeling," IEEE Transactions on Electron Devices, vol. 59, No. 6, Received Dec. 1, 2011, 9 pages.

Radisavljevic et al., "Single-layer MoS2 transistors," Nature Nanotechnology, vol. 6, Jan. 30, 2011, pp. 147-150.

Wang et al., "Electronics and optoelectronics of two-dimensional transition metal dichalcogenides," Nature Nanotechnology, vol. 7, Nov. 6, 2012, pp. 699-712.

Westerheim et al., "Substrate bias effects in high-aspect-ratio SiO2 contact etching using an inductively coupled plasma reactor," Journal of Vacuum Science & Technology A, vol. 13, 853 (1995); doi: 10.1116/1.57984, Received Sep. 30, 1994, 7 pages.

Zhan et al., "Large Area Vapor Phase Growth and Characterization of MoS2 Atomic Layers on SiO2 Substrate," Small, 8: 966-971. doi:10.1002/smll.201102654, Feb. 15, 2012, 24 pages.

Zhao et al., "Air Stable p-Doping of WSe2 by Covalent Functionalization," ACS Nano, vol. 8, No. 10, 2014, Received Aug. 16, 2014, pp. 10808-10814.

* cited by examiner

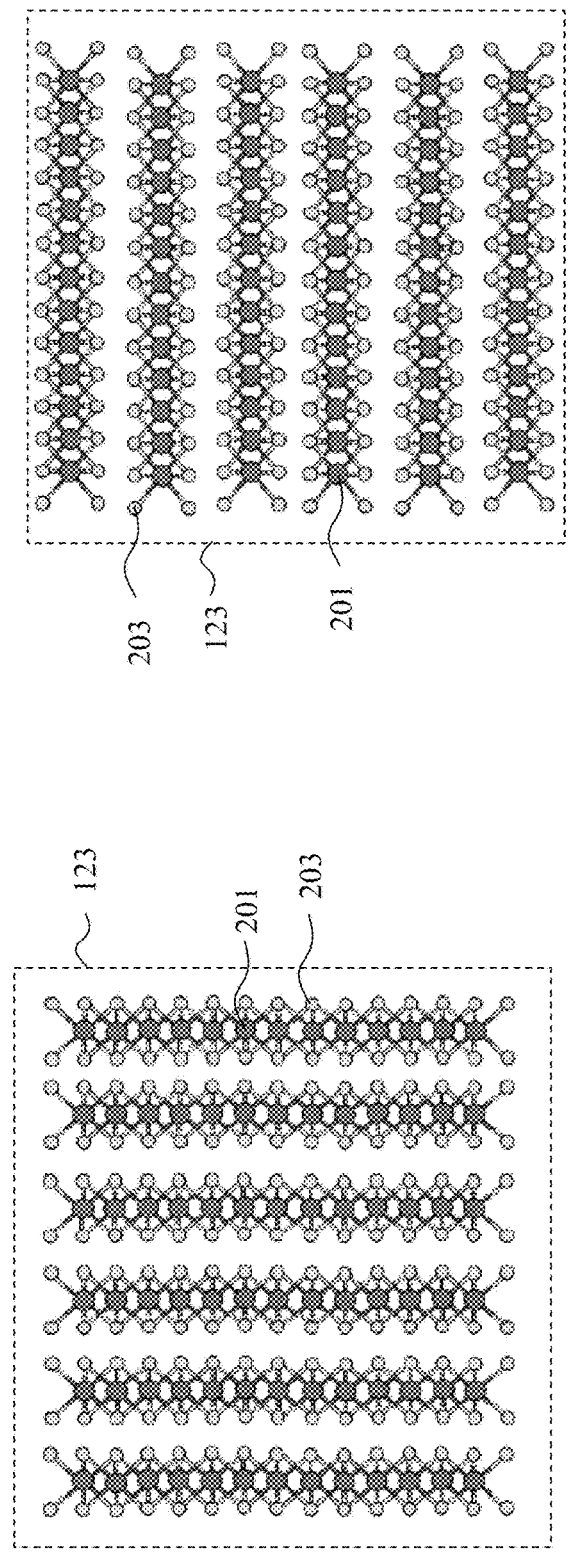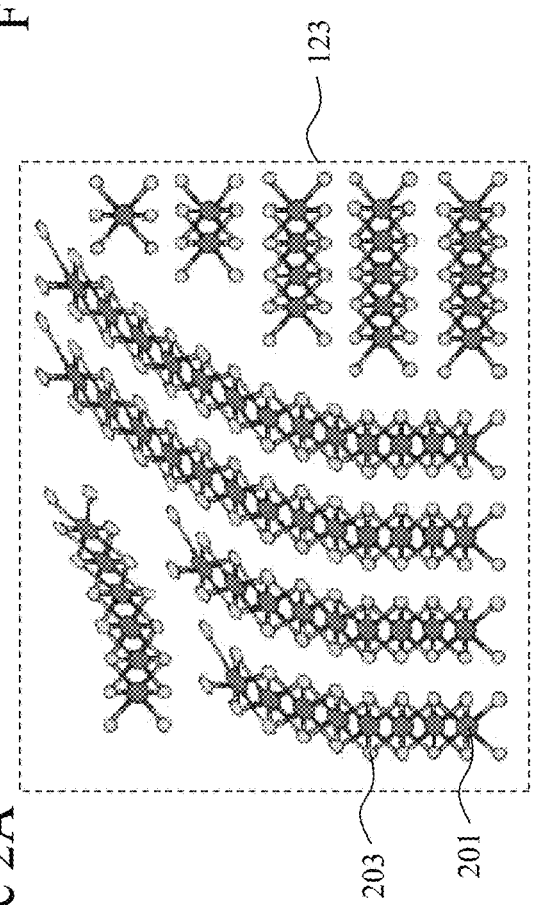
Figure 2A
Figure 2B
Figure 2C

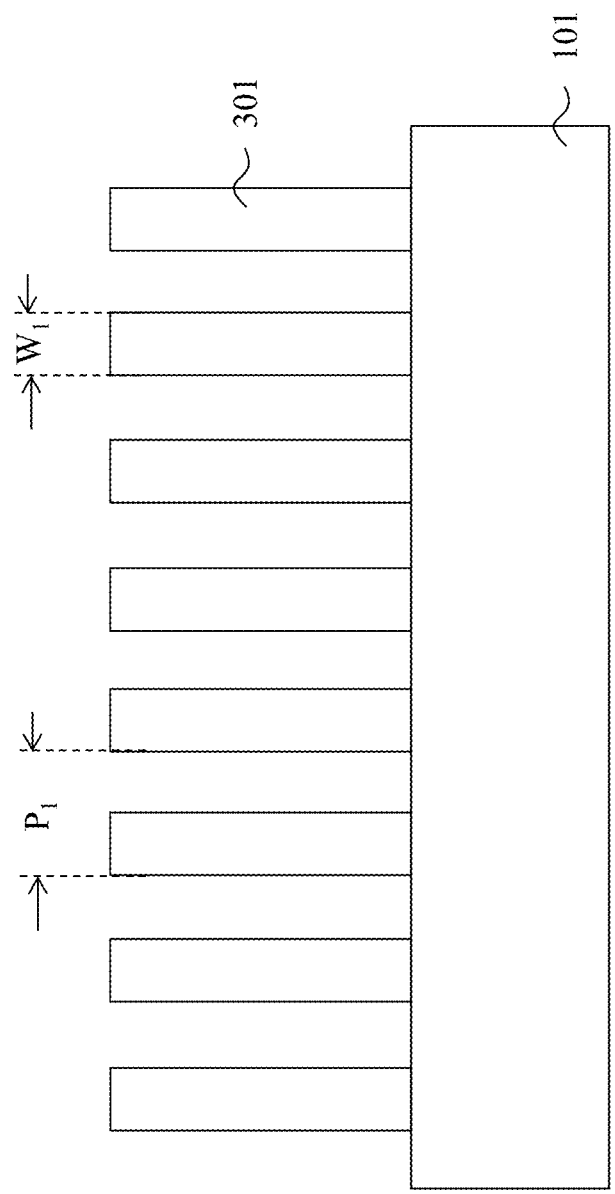

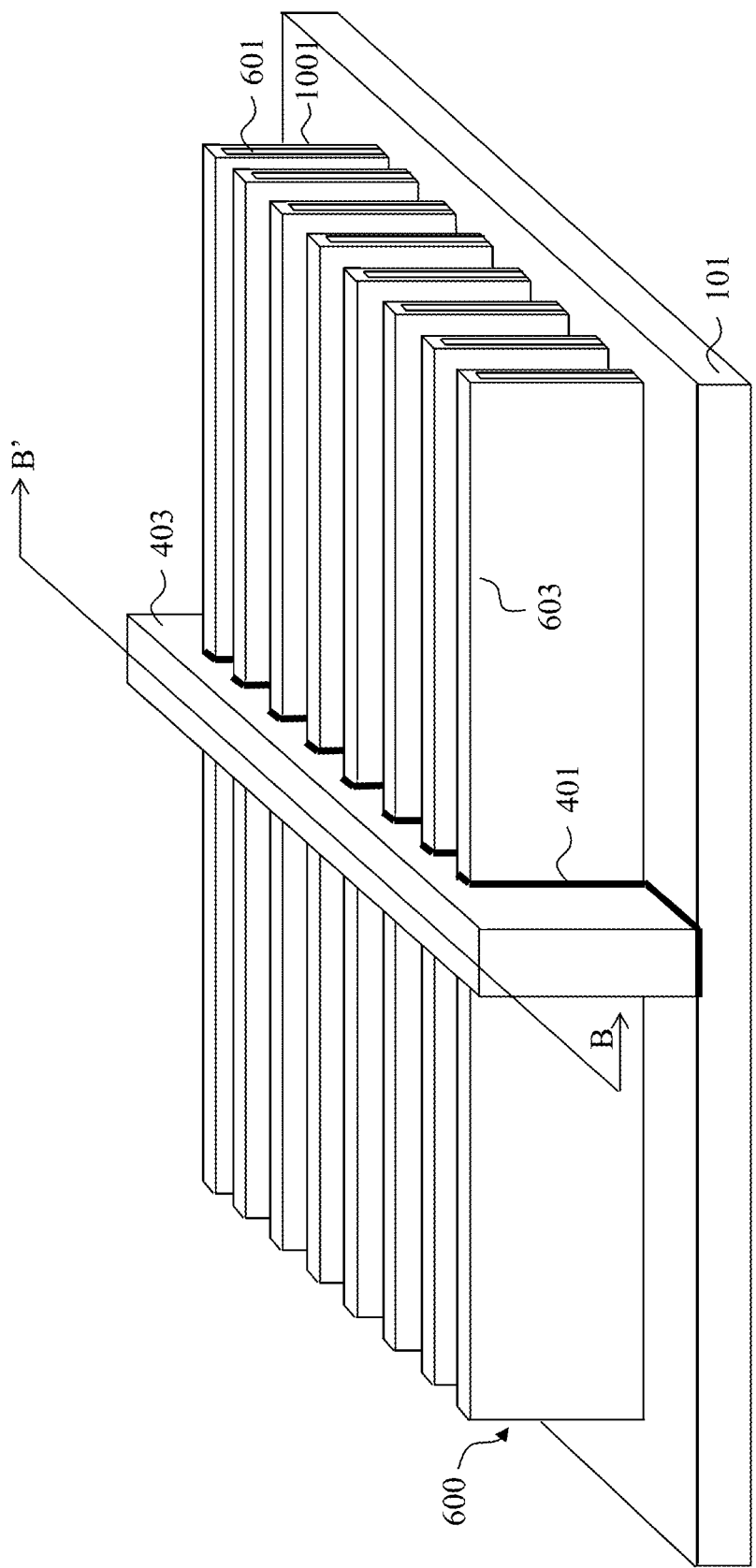

FIELD-EFFECT TRANSISTORS HAVING TRANSITION METAL DICHALCOGENIDE CHANNELS AND METHODS OF MANUFACTURE

This application is a division of U.S. patent application Ser. No. 16/047,974 filed Jul. 27, 2018 and entitled "Field-Effect Transistors Having Transition Metal Dichalcogenide Channels and Methods of Manufacture," which application is a division of U.S. patent application Ser. No. 15/001,909 filed Jan. 20, 2016 and entitled "Field-Effect Transistors Having Transition Metal Dichalcogenide Channels and Methods of Manufacture," now U.S. Pat. No. 10,269,791 issued Apr. 23, 2019, which application claims the benefit of provisionally filed U.S. Patent Application Ser. No. 62/133,813, filed Mar. 16, 2015 and entitled "Field-Effect Transistors Having Transition Metal Dichalcogenide Channels and Methods of Manufacture," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C illustrate various structures of the TMD layer, in accordance with some embodiments.

FIGS. 3A-3B illustrate a patterning of the TMD layer into fins, in accordance with some embodiments.

FIGS. 10A-10B illustrate a formation of a second TMD layer, in accordance with some embodiments.

DETAILED DESCRIPTION

Figure 1A:
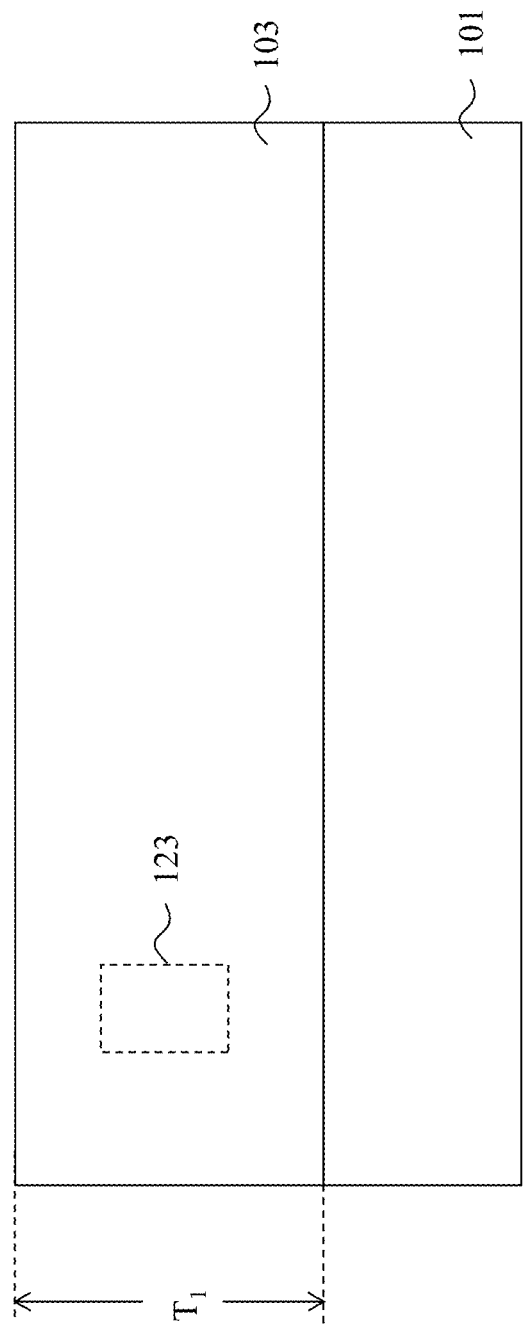
FIGS. 1A-1C illustrate transition metal dichalcogenide (TMD) layer over a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, it is an object of embodiments disclosed herein to provide high density field-effect transistors having a transition metal dichalcogenide (TMD) channel material, where the drive current per unit wafer area or device footprint is maximized. Embodiments enable the drive current per footprint to be higher than other field effect transistors having a TMD channel material formed on a wafer surface. Looking at FIG. 1A, there is illustrated a substrate 101 and a transition metal dichalcogenide (TMD) layer 103 formed over the substrate 101. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The TMD layer 103 is a dichalcogenide material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the TMD layer 103 include $MoS_2$, $WS_2$, $WSe_2$, $MoSe_2$, $MoTe_2$, $WTe_2$ and the like. However, any suitable transition metal dichalcogenide material may alternatively be used. Once formed, the dichalcogenide material is in a layered structure with a plurality of two-dimensional layers of the general form X-M-X, with the chalcogen atoms in two planes separated by a plane of metal atoms.

In an embodiment the TMD layer 103 may be formed utilizing a direct deposition process, whereby the dichalcogenide material is directly formed over the substrate 101. In this embodiment the TMD layer 103 may be formed using a chemical vapor deposition (CVD) process by introducing two or more precursor materials to the substrate 101, wherein the precursor materials react upon the surface of the substrate 101 to form the dichalcogenide material for the TMD layer 103. The TMD layer 103 may be formed to have a first thickness $T_1$ of greater than about 10 nm, such as by being greater than about 50 nm or greater than about 100 nm.

In a particular embodiment using a CVD process for the formation of the dichalcogenide material (e.g. $MoS_2$) for the TMD layer 103, the CVD process may be performed as described in Ling, Xi et al., *Role of the Seeding Promoter in $MoS_2$ Growth by Chemical Vapor Deposition*, Nano Letters (2014) (hereinafter "Ling"), which reference is hereby incorporated herein by reference. In such an embodiment, the substrate 101 (comprising, e.g., $SiO_2$) may be initially treated and cleaned in order to form a hydrophilic surface. In an embodiment the substrate 101 may be cleaned and treated using a wet cleaning solution. For example, in one embodiment a piranha solution may be spread on the substrate 101 in order to clean the substrate 101 and provide a hydrophilic surface on the substrate 101. However, any suitable cleaning solution may alternatively be utilized.

Once the substrate 101 (comprising e.g., $SiO_2$) has been cleaned and a hydrophilic surface has been formed, a seeding promoter (not separately illustrated in FIG. 1A) may be applied to the substrate 101 in order to assist and promote the growth of the dichalcogenide material for the TMD layer 103. In an embodiment the seeding promoter may be formed as described in Ling, and may be a material such as perylene-3,4,9,10-tetracarboxylic acid tetrapotassium salt (PTAS); crystal violate; 1, 2, 3, 4, 8, 9, 10, 11, 15, 16, 17, 18, 22, 23, 24, 25-hexadecafluoro-29H, 31H-phthalocyanine ($F_{16}$CuPc); 3,4,9,10-perylene-tetracarboxylicacid-dianhydride (PTCDA); copper phthalocyanine (CuPC); (dibenzo{[f,f']-4,4',7,7'-tetraphenyl-diindeno[1,2,3-cd:1',2',3'-lm] perylene (DBP); 4'-nitrobenzene-diazoaminoazobenzene (NAA); N,N'-bis(3-methylphenyl)-N,N'-diphenyl-9,9-spirobifluorene-2,7-diamine (spiro-TDP); Tris(4-carbazoyl-9-ylphenyl) amine (TCTA); Bathocuproine (BCP); 1,3,5-tris (N-phenylbenzimiazole-2-yl)benzene (TPBi); 2,2',7,7'-tetra (N-phenyl-1-naphthyl-amine)-9,9'-spirobifluorene (spiro-2-NPB); iridium, tris(2-phenylpyidine) ($Ir(ppy)_3$); gold; or the like, and may be placed on the substrate 101, using, e.g., a thermal evaporation technique to a thickness of between about 0.7 Å to about 5 Å.

In a particular example for depositing the seeding promoter, 50 µM of PTAS and 100 µM of crystal violet are placed in water in order to form a solution, and the solution is then dispersed onto a cleaned surface of the substrate 101. Once the solution has been placed, a drying gas, such as nitrogen, is flowed over the solution to dry the substrate surface.

Figure 1B:
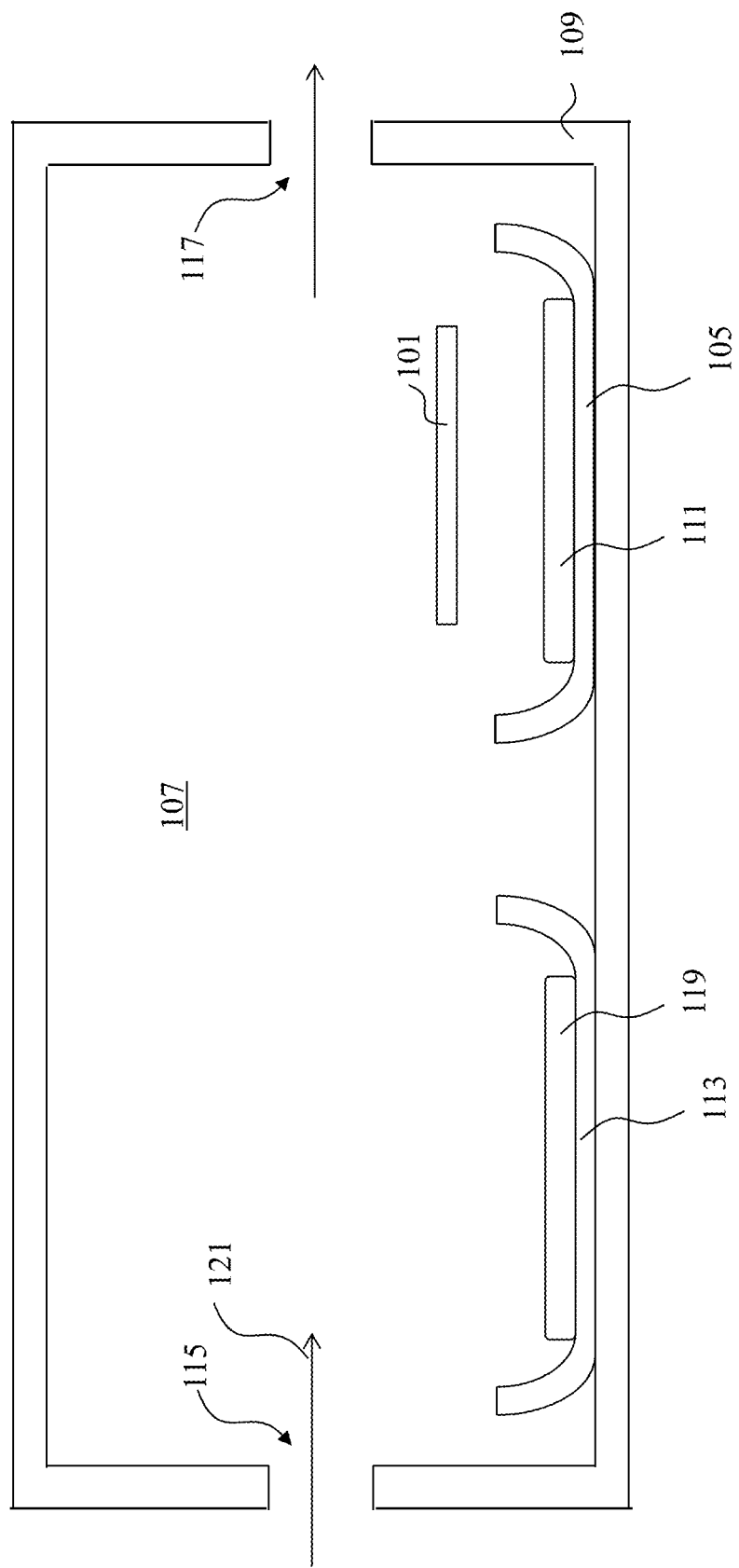

FIG. 1B illustrates that, once the seeding promoters have been placed, the substrate 101 (with the seeding promoters) may be placed face down over a first crucible 105 within a reaction chamber 107 surrounding by a housing 109. In an embodiment the first crucible 105 is formed from a material that won't significantly react or pollute or otherwise contaminate the substrate 101 or a first precursor material 111 (described further below) while also being able to withstand the environment from the reaction chamber 107. In an embodiment the first crucible 105 may be quartz, although any other suitable material may alternatively be utilized. The first crucible 105 may have, e.g., a depth of less than about 50 mm and a diameter of between about 10 mm and about 500 mm, although any other suitable dimensions may alternatively be utilized depending in part on the size of the substrate 101.

The first precursor material 111 may be placed within the first crucible 105. In an embodiment the first precursor material 111 comprises one of the precursors that are utilized in order to form the dichalcogenide material for the TMD layer 103. For example, in an embodiment in which the dichalcogenide material is $MoS_2$, the first precursor material 111 may be $MoO_3$ in a powder form. The substrate 101 may be placed face down over the first crucible 105 in any configuration in which the first precursor material 111 and a second precursor material 119 (discussed further below) can reach the target surface to react, such as by being offset from the first precursor material 111 using, e.g., pins, although any configuration may be utilized. In one embodiment the substrate 101 may be placed within the first crucible in a face down configuration, although any suitable configuration may alternatively be utilized.

The first crucible 105 is placed within the housing 109 of the reaction chamber 107. The housing 109 may comprise a heat resistant material, such as quartz, silicon carbide, combinations of these, or the like, and provide an interior chamber for the first crucible 105, a second crucible 113, and any heating or cooling elements that may be desired to control the internal environment of the reaction chamber 107. The external housing 109 may also provide an inlet 115 and an outlet 117 in which a non-reactive gas such as argon or nitrogen or a reactive gas such as $H_2S$ may be flowed into and out of the reaction chamber 107.

The second crucible 113 is utilized to hold a second precursor material 119 within the reaction chamber 107. In an embodiment the second crucible 113 is similar to the first crucible 105, such as being a material such as quartz, silicon carbide, combinations of these, or the like. Additionally, the second crucible 113 and, therefore, the second precursor material 119, is placed within the reaction chamber 107 upstream (relative to the eventual flow of the non-reactive gas represented in FIG. 1B by the arrows labeled 121), of the first crucible 105.

The second precursor material 119 is placed within the second crucible 113 within the reaction chamber 107. In an embodiment the second precursor material 119 is one that will react with the first precursor material 111 (within the first crucible 105) to form the dichalcogenide material for the TMD layer 103. For example, in the embodiment in which the first precursor material 111 and the second precursor material 119 will be used to form $MoS_2$ and the first precursor material 111 is $MoO_3$, the second precursor material 119 may be elemental sulfur in a powder form.

Once the first precursor material 111 (e.g., $MoO_3$) has been placed within the first crucible 105 and the second precursor material 119 (e.g., sulfur) has been placed within the second crucible 113, the reaction chamber 107 may be initially purged by flowing a non-reactive gas through the reaction chamber 107. In an embodiment the purging may be performed by flowing argon (with, e.g., 99.999% purity) through the reaction chamber 107 at a flow rate of about 500 sccm for about 2 minutes. Once purged, the flow of the non-reactive gas (e.g., argon) may be reduced so that the non-reactive gas may be used as a carrier gas for the reaction. In an embodiment the carrier gas may be reduced to a steady flow of about 5 sccm.

After the purging has been performed, the reaction chamber 107 may be heated using, e.g., heating elements (not separately illustrated) within the housing 109 to a suitable reaction temperature. In an embodiment in which $MoS_2$ is formed from $MoO_3$ and sulfur, the reaction chamber 107 may be heated at a rate of about 15° C./min until the reaction chamber 107 has reached a temperature of about 650° C. However, any other suitable temperatures and rates of heating, depending upon the desired material to be formed, may also be utilized.

Once at the desired reaction temperature, the second precursor material 119 (e.g., sulfur) will evaporate out of the second crucible 113 and be carried by the carrier gas (e.g., argon) to the first crucible 105, where it will react with the first precursor material 111 (e.g., $MoO_3$) at a pressure of between about 0.1 torr and about 760 torr, such as about 1 atmosphere. The reaction will form the dichalcogenide material for the TMD layer 103 (e.g., $MoS_2$) on the surface of the substrate 101. In an embodiment the dichalcogenide material may be grown for a time sufficient to form the TMD layer 103, such as about three minutes. Additionally, the TMD layer 103 may be grown to the first thickness $T_1$ of greater than about 10 nm, such as by being greater than about 50 nm or greater than about 100 nm.

Once the TMD layer 103 has been formed to the desired thickness, the reaction chamber 107 is cooled to room temperature and then purged to remove any remaining gaseous precursors. In an embodiment the purge may be performed by again flowing a non-reactive gas such as argon through the reaction chamber 107. In a particular example argon may be flowed through the reaction chamber 107 at a flow rate of about 500 sccm in order to purge the reaction chamber 107. Once purged, the substrate 101 with the TMD layer 103 may be removed from the reaction chamber 107 for further processing.

Figure 1C:
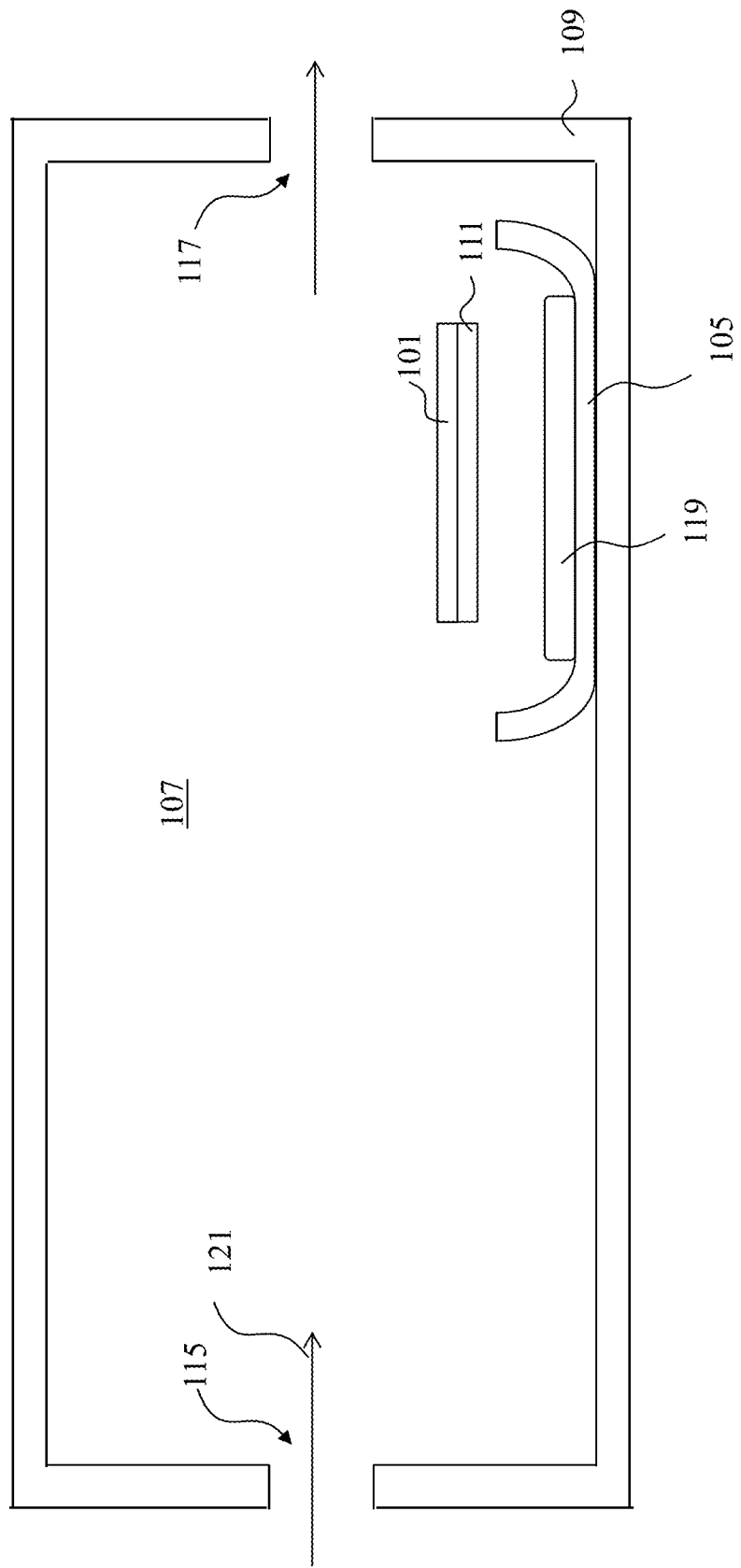

However, while the TMD layer 103 may be formed as described above, this description is intended to be illustrative and not limiting. For example, FIG. 1C illustrates another embodiment in which the TMD layer 103 (comprising, e.g., $MoS_2$) may be formed by initially forming the first precursor material 111 (in this embodiment, e.g., molybdenum) into a layer on the substrate 101 (e.g. silicon oxide) and then reacting the first precursor material 111 into the TMD layer 103, as described in Zhan, Yongjie, *Large Area Vapor Phase Growth and Characterization of MoS₂ Atomic Layers on SiO2 Substrate*, Small, Vol. 8, 7, pp. 966-971 (2012) (hereinafter "Zhan"), which reference is hereby incorporated by reference. In this embodiment the first precursor material 111 may be a precursor material that will be used in a later process to form the TMD layer 103. In a particular example the first precursor material 111 may be a precursor such as molybdenum (Mo) or tungsten (W). Alternatively, the first precursor material 111 may comprise a non-conductive dielectric material that can provide an initial material for conversion into the TMD layer 103, such as $MoO_3$, or the like. However, any other suitable material or method of manufacture may alternatively be utilized. The first precursor material 111 may be formed directly on the substrate 101 using any suitable deposition process, such as CVD, PVD, ALD, or the like.

Once the first precursor material 111 (e.g., Mo) is formed on the substrate 101, the substrate 101 and the first precursor material 111 are placed face down over the first crucible 105 (without any additional first precursor material 111 being located within the first crucible 105 as in the embodiment described above with respect to FIG. 1B). The second precursor material 119 (e.g., sulfur for a sulfurization process or selenium for a selenization process) may be placed within the first crucible 111, and the second crucible 113 may be either left empty or else removed from the process.

Once in place inside the reaction chamber 107, the reaction chamber 107 may be initially purged in order to remove any undesired impurities from the reaction chamber 107. In an embodiment the purge may be performed by flowing nitrogen ($N_2$) through the reaction chamber at a flow rate of between about 150 sccm and about 200 sccm for about 15 minutes. However, any suitable method of purging may alternatively be utilized.

After the reaction chamber 107 has been purged, the temperature of the reaction chamber 107 is increased to a desired reaction temperature. In a particular embodiment in which $MoS_2$ is formed from molybdenum and sulfur, the temperature is increased in stages, with an initial rate of temperature increase increasing the reaction chamber 107 from room temperature to about 500° C. in about 30 minutes. Next, the temperature is increased to the desired reaction temperature of between about 500° C. and about 1000° C., such as about 750° C. in about 90 minutes. However, any suitable temperatures or other processes conditions that will react the second precursor material 113 (e.g., sulfur) with the first precursor material 111 (e.g., Mo) may alternatively be utilized, and all such temperature and process conditions are fully intended to be included within the embodiments.

Once the desired reaction temperature has been reached, the temperature of the reaction chamber 107 is maintained in order to react the second precursor material 119 (e.g., sulfur which has turned into a vapor and been transported from the first crucible 111 to the substrate 101) with the first precursor material 111 (e.g., molybdenum) and form the TMD layer 103 from the first precursor material 111 on the substrate 101. The reaction may be continued for a time sufficient to grow the TMD layer 103 to the desired thickness and, in some embodiments, to react the first precursor material 111 with the second precursor material 119 to fully transform the first precursor material 111 into the TMD layer 103.

However, the processes as described above are intended to be illustrative only and are not intended to be limiting upon the embodiments. Rather, any suitable process of forming or placing the TMD layer 103 onto the substrate 101 may alternatively be utilized. For example, a CVD process using precursors such as $MoO_3$ and $H_2S$, or precursors such as Mo and $H_2S$, may also be utilized. Alternatively, a physical vapor deposition PVD process which utilizes a $MoS_2$ target may be utilized. Additionally, any other suitable processes, such as dissociation of spin-on coated (NH$_4$)$_2$MoS$_4$, or growing the TMD material on a substrate such as copper, nickel, or sapphire and then transferring the TMD material to the substrate 101, may be used.

In yet another embodiment, the TMD material for the TMD layer 103 may be formed in bulk separately from the substrate 101 and then a layer of the bulk TMD material is removed and placed onto the substrate 101. For example, a mechanical exfoliation using, e.g., a Scotch-type tape may be utilized to remove a layer or layers of TMD materials from a bulk TMD material and then the TMD material may be transferred to the substrate 101 to form the TMD layer 103. Alternatively, a liquid exfoliation of the TMD materials from the bulk TMD material using, e.g., an intercalation such as n-butyl lithium dissolved in hexane may be utilized to remove the TMD layer 103 for transport to the substrate 101. Any suitable method of forming or placing the TMD layer 103 may be used, and all such methods are fully intended to be included within the scope of the embodiments.

FIGS. 2A-2C illustrate a close up view (although still not drawn to scale) of portions of different orientations of the two-dimensional layers of the TMD layer 103 within the dashed box 123 within FIG. 1A that may be achieved (although the molecules themselves are three-dimensional) on a planar substrate. In particular, in an embodiment in which the dichalcogenide material of the TMD layer 103 is MoS$_2$ (wherein in FIGS. 2A-2C the molybdenum atoms are larger circles labeled with reference number 201 and sulfur atoms are smaller circles labeled 203), FIG. 2A illustrates the material of the TMD layer 103 having primarily a vertical stack structure. In this embodiment the plane of chalcogen or metal atoms are substantially perpendicular to the plane of the substrate 101. That is, the plane of the TMD layer 103 is oriented substantially perpendicular to the plane of the substrate 101, although it does not necessarily have to be exactly perpendicular to the substrate 101. For example, the deviation of the plane of the TMD layer 103 from perpendicularity may be less than 45°, such as less than 20°, or even less than 10°.

The illustrated stacked structure may be achieved by utilizing process conditions that cause a diffusion of the second precursor material 119 (e.g., sulfur) to be the rate-limiting process for forming the TMD layer 103 as described in Kong, Desheng, *Synthesis of MoS$_2$ and MoSe$_2$ Films with Vertically Aligned Layers*, Nano Letters, 13, 1341-1347 (2013), which reference is hereby incorporated herein by reference. In an embodiment in which the first precursor material 111 (e.g., molybdenum) is initially formed on the substrate 101, the rate-limiting process may be set by raising the temperature of the process such that the reaction rate is not the rate-limiting process, such as by raising the process to a temperature of between about 200° C. and about 700° C., such as about 550° C. at a pressure of between about 0.01 Torr and about 760 Torr, such as about 100 mTorr and a flow rate of a non-reactive gas such as argon of between about 10 sccm and about 10 slm, such as about 10 sccm. However, any other suitable process conditions may be utilized.

By using these process conditions, the chemical conversion within the reaction chamber will occur at a faster rate than the diffusion of the second precursor material 119 into the first precursor material 111. As such, due to the anisotropic structure of the resulting material, diffusion along the layers through van der Waals gaps occurs at a faster rate than diffusion across the layers. Accordingly, the layers will naturally orient primarily perpendicular to the film, exposing van der Waals gaps for a faster reaction.

FIG. 2B illustrates another stacked structure, wherein the dichalcogenide material of the TMD layer 103 has a primarily horizontal stacked structure. In this embodiment the illustrated horizontal stacked structure may be achieved by causing the overall reaction to be reaction limited instead of diffusion limited (as discussed above with respect to FIG. 2A). As such, by utilizing a temperature that causes the reaction to be reaction limited the second precursor material 109 will diffuse across the layers and the layers will naturally orient parallel with the film.

FIG. 2C illustrates a portion of the TMD layer 103 wherein the individual layers may be both vertically orientated or horizontally oriented. In this figure, the TMD layer 103 (which may still have the individual layers being primarily vertical or primarily horizontal achieved as described above with respect to FIGS. 2A-2B) will still have some portions wherein the individual layers will have a vertical orientation and a horizontal orientation.

Figure 3A:
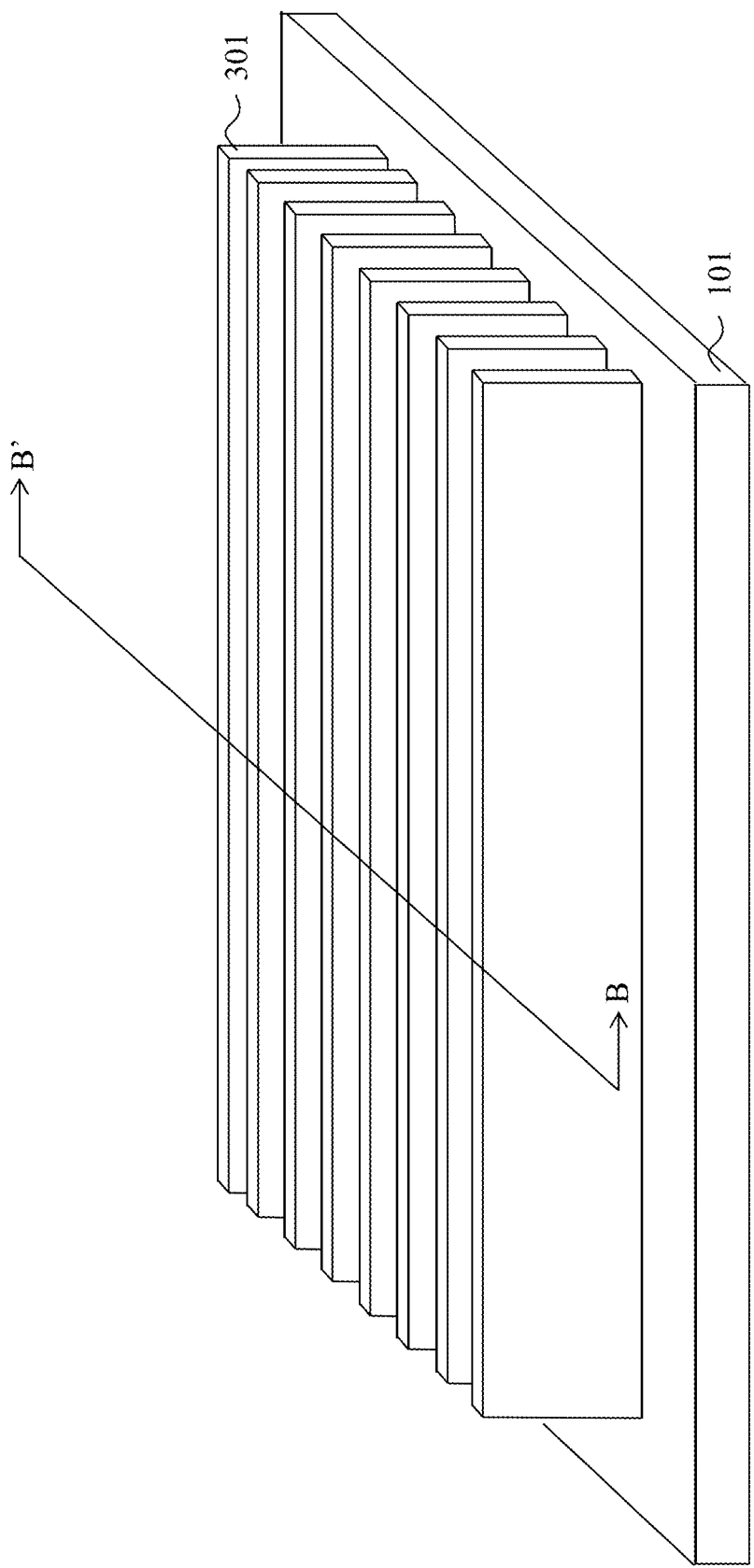

FIGS. 3A-3B illustrate a patterning of the TMD layer 103 into a series of fins 301 that comprise one or more slabs of the TMD material after the TMD layer 103 has been formed (with FIG. 3B being a cross-section view of FIG. 3A along line B-B'). In an embodiment the TMD layer 103 may be patterned using a photolithographic masking and etching process. In such a process, a photosensitive material (not separately illustrated in FIGS. 3A-3B) is initially placed on the TMD layer 103 and then exposed to a patterned energy source such as light. The photosensitive material is then developed by, e.g., separating the exposed portion of the photosensitive material and the unexposed portion of the photosensitive material to form a patterned photoresist. The patterned photoresist is then utilized as a mask during an anisotropic etching process, whereby portions of the TMD layer 103 that are exposed by the patterned photoresist are removed, thereby patterning the underlying TMD layer 103 into the shape of the patterned photoresist.

In an embodiment the fins 301 may be formed to have a first width $W_1$ that may be as small as a single slab or one monolayer of the TMD material within the TMD layer 103. For example, the fins 301 may have a thickness of about 6 Å to about 7 Å. Alternatively, the first width $W_1$ may correspond to multiple layers of the TMD material within the TMD layer 103, such as being between about 1 to about 10 layers of the TMD material within the TMD layer 103, or 6 Å to about 70 Å, although any suitable number of layers may alternatively be utilized. Additionally, in an embodiment in which the fins 301 are intended to be utilized together (as discussed further below with respect to FIG. 4A), the fins 301 may be formed to have a first pitch $P_1$ of less than about 100 nm, such as being less than 50 nm or even less than 15 nm.

In the embodiment illustrated in FIGS. 3A-3B, the fins 301 have sidewalls that are perpendicular or mostly perpendicular with the substrate 101. In order to achieve this orientation, the fins 301 may be etched using etching processes and parameters specific to forming perpendicular sidewalls. For example, in an embodiment the fins 301 may be formed using the patterned photoresist and, e.g., a dry etch plasma process. In this embodiment exposed portions of the fins 301 (e.g., those portions not covered by the patterned photoresist) that have a vertical orientation (such as the orientation discussed above with respect to FIG. 2A) are exposed to plasma such as an argon plasma, allowing for a formation of the sidewalls to be perpendicular or mostly perpendicular.

However, a dry etch process using an argon plasma is not the only process that may be utilized to form the fins 301. In other embodiments, a laser may be directed at the TMD layer 103 to initiate a heat induced etching process, or a wet etching process using nitric acid in a temperature range of between about 80° C. and 90° C. may be utilized to etch the material of the TMD layer 103. Any suitable method or process may alternatively be utilized to form the fins 301, and all such processes are fully intended to be included within the scope of the embodiments.

Figure 4A:
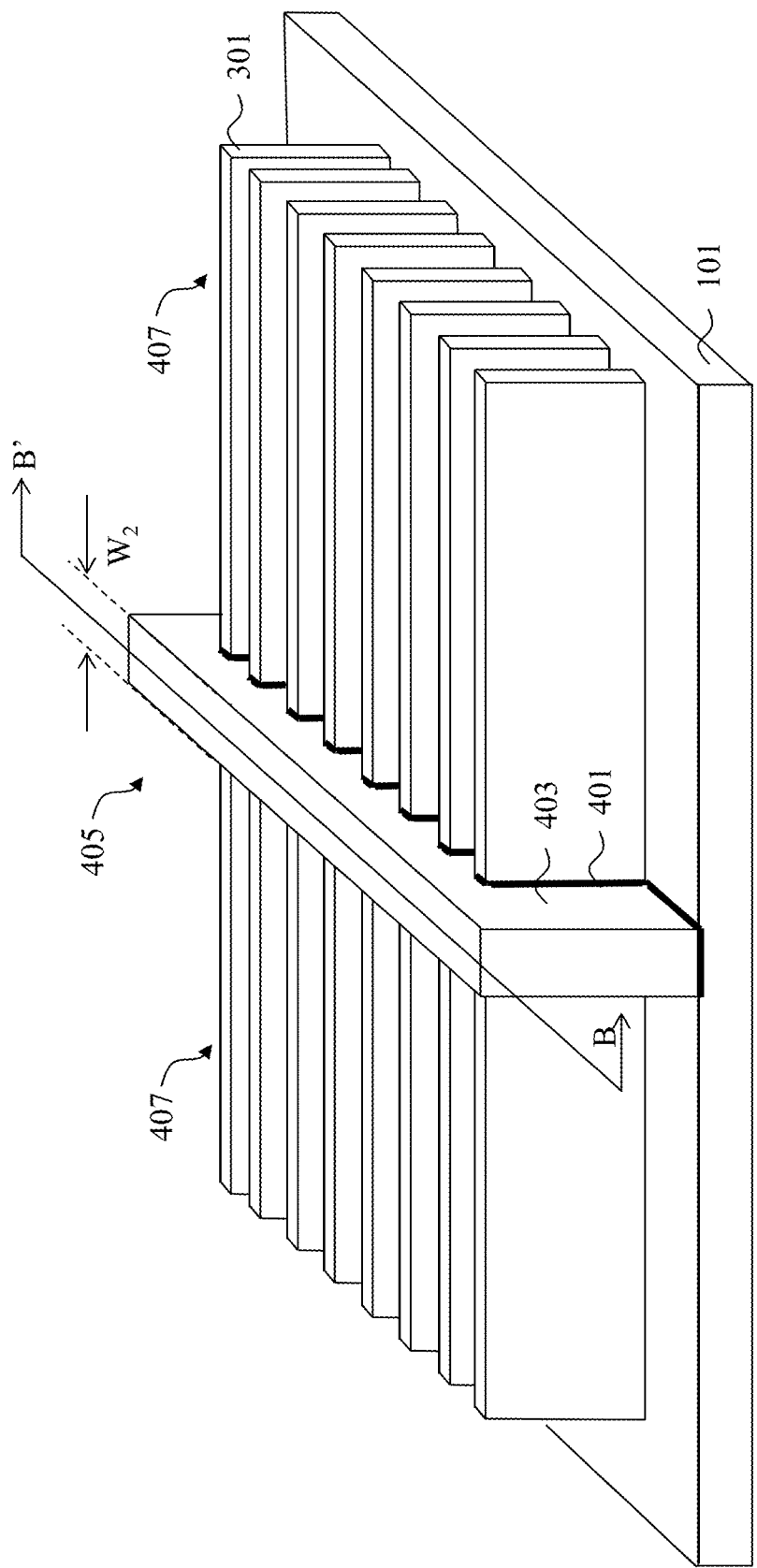
FIGS. 4A-4C illustrate a formation of a gate dielectric and a gate electrode over the fins, in accordance with some embodiments.
Figure 4B:
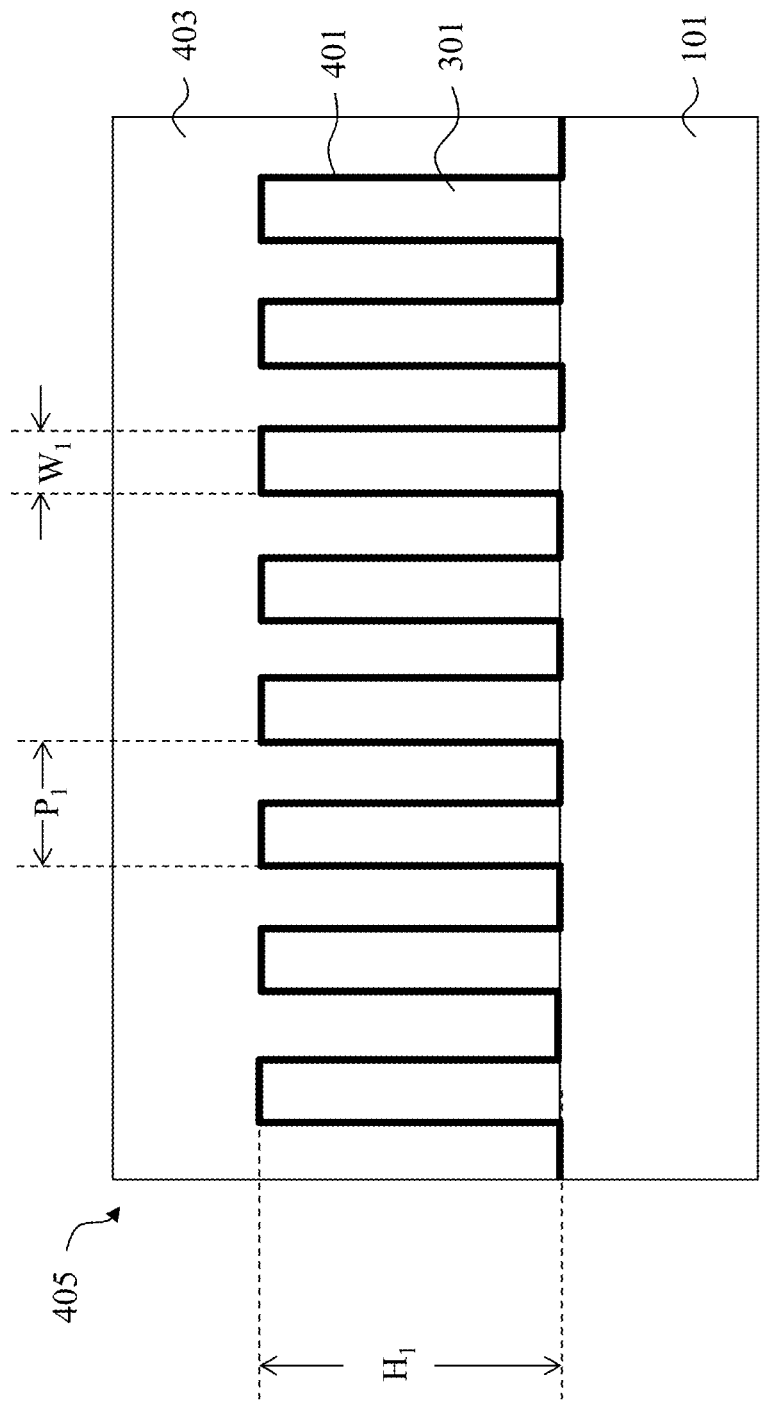

FIGS. 4A-4B illustrate a formation of a gate dielectric 401 and a gate electrode 403 over and between the fins 301 (with FIG. 4B being a cross-section view of FIG. 4A along line B-B'). In an embodiment the gate dielectric 401 may comprise a material such as silicon dioxide or silicon oxynitride with a thickness ranging from about 3 angstroms to about 100 angstroms, such as about 10 angstroms. The gate dielectric 401 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric 401. The gate dielectric 401 may be formed using a process such as atomic layer deposition, chemical vapor deposition, sputtering, or the like. Additionally, because the gate dielectric 401 is formed on the sidewall and top surface of the fins 301, a portion of the sidewall of the gate dielectric 401 is also perpendicular to the surface of the substrate 101.

The gate electrode 403 may be formed by initially forming a gate electrode layer (not separately illustrated in FIGS. 4A-4B). In an embodiment the gate electrode layer comprises a conductive material and may be selected from a group comprising of polycrystalline-silicon (poly-Si), polycrystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc.

The gate electrode layer may be deposited by chemical vapor deposition (CVD), sputter deposition, or other techniques known and used in the art for depositing conductive materials. The thickness of the gate electrode layer may be in the range of about 200 angstroms to about 4,000 angstroms. The top surface of the gate electrode layer usually has a non-planar top surface, and may be planarized prior to patterning of the gate electrode layer or gate etch. Dopants may or may not be introduced into the gate electrode layer at this point. Dopants may be introduced, for example, by molecular doping techniques thru charge transfer.

Once the gate electrode layer has been formed, the gate electrode layer may be patterned to form the gate electrode 403. The gate electrode 403 may be formed by depositing and patterning a gate mask (not illustrated in FIGS. 4A-4B) on the gate electrode layer using, for example, deposition and photolithography techniques known in the art. The gate mask may incorporate commonly used masking materials, such as (but not limited to) photoresist material, silicon oxide, silicon oxynitride, and/or silicon nitride. Once the mask has been placed, the gate electrode layer and the gate dielectric 401 may be etched using plasma etching to form the gate dielectric 401 and the gate electrode 403 into a gate stack 405. In an embodiment the gate electrode 403 may be patterned to have a second width $W_2$ of between about 0.5 nm and about 100 nm, such as about 5 nm. Additionally, because the gate electrode 403 is formed on the sidewall of the fins 301, a sidewall of the gate electrode 403 is also perpendicular to the surface of the substrate 101, and the gate electrode 403 will also comprise a left gate, a right gate, and a top gate for each one of the fins 301.

Additionally, after the gate dielectric 401 and the gate electrode 403 have been formed, portions of the fins 301 exposed by the gate dielectric 401 and the gate electrode 403 may be doped in order to form source/drain regions 407 on either side of a channel region (not separately illustrated in FIGS. 4A-4B but located beneath the gate dielectric 401 and the gate electrode 403) as described by Zhao, Peida, *Air Stable p-Doping of WSe_2 by Covalent Functionalization*, ACS Nano 2014 Oct. 22; 8(10):10808-14, which reference is hereby incorporated herein by reference. In an embodiment in which the fins 301 comprise a material such as $WSe_2$, the source/drain regions 407 may be p-doped, for example, by $NO_2$ molecules, which are expected to be absorbed both physically and chemically on top of the $WSe_2$ surface. In some embodiments the doping may be performed by exposing the fins 301 to 0.05% $NO_2$ in $N_2$ gas for about 10 min. Alternatively, in an embodiment in which the fins 301 comprise $WSe_2$ or $MoS_2$ and are desired to be n-doped, the source/drain regions 407 may be doped with potassium (K) atoms by exposing, e.g., the fins 301 to potassium vapors for about 1 minute to about 120 minutes. However, any suitable dopants and any suitable method of doping may alternatively be used.

By forming fins 301 from the TMD layer 103, the transistors formed using the fins 301, the gate dielectric 401, and the gate electrode 403 have an effective device width of $2H_1+W_1$ per fin 301. Additionally, when there are $1/P_1$ fins 301 per unit width, the effective device width is $(2H_1+W_1)/P_1$. In embodiments in which the first width $W_1$ is much less than $2H_1$, then the equation simplifies into approximately $2H_1/P_1$. Further, in embodiments in which the first height $H_1$ is greater than half of the first pitch $P_1$, a higher effective device density can be achieved over planar field-effect transistors formed from planar TMD materials.

Figure 4C:
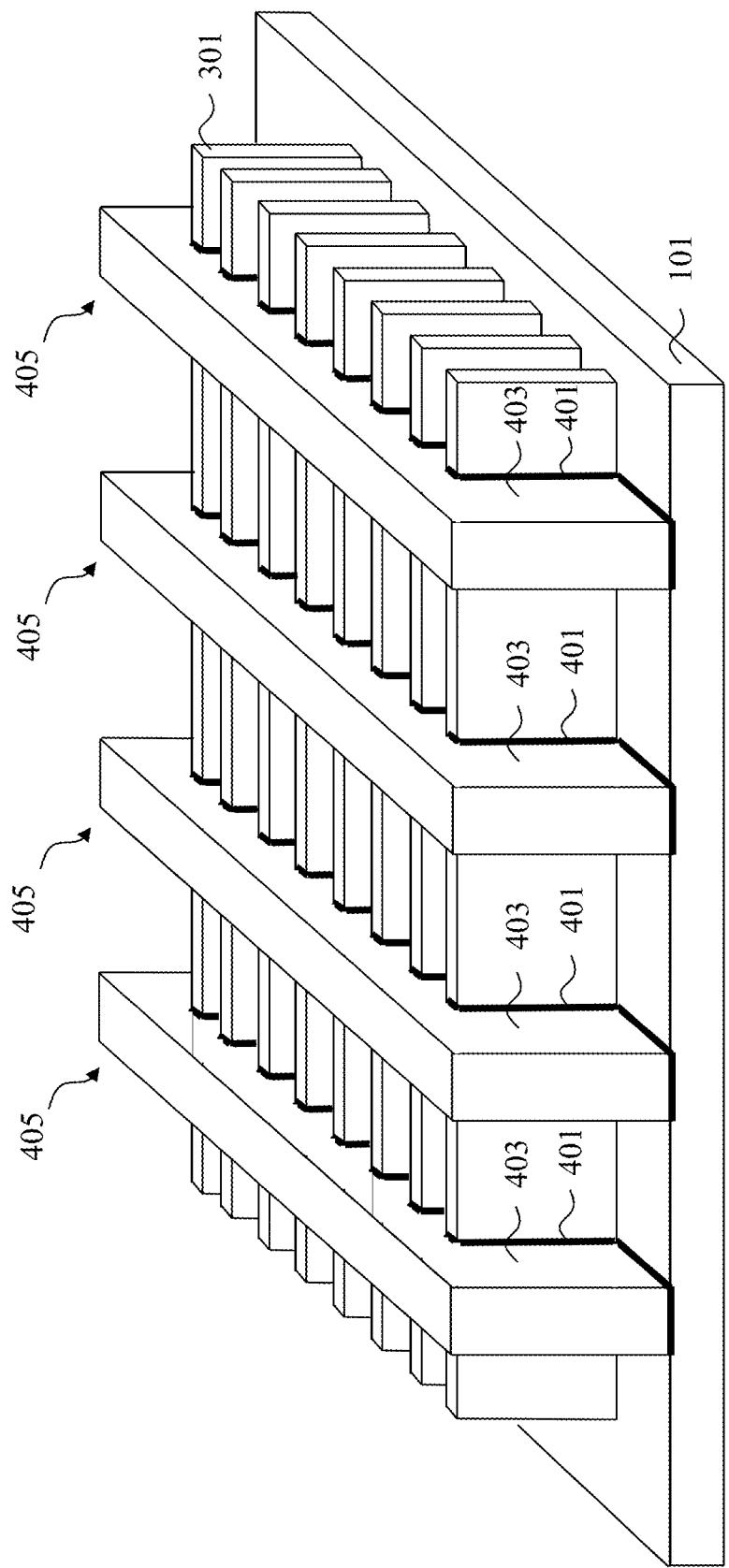

FIG. 4C illustrates another embodiment in which multiples gate stacks 405 are formed over each one of the fins 301. In this embodiment each of the gate dielectrics 401 and the gate electrodes 403 may be formed simultaneously with the process as described above with respect to FIGS. 4A-4B, but the gate dielectrics 401 and the gate electrodes 403 are located so as to form multiple devices within each one of the single fins 301.

By forming multiple devices within a single one of the fins 301, multi-device structures may be manufactured using the fins 301 as described herein. For example, logic gates such as multiple input NAND or NOR gates may be manufactured. However, any other suitable devices may be formed using multiple gate dielectrics 401 and multiple gate electrodes 403 over each one of the fins 301.

Figure 5:
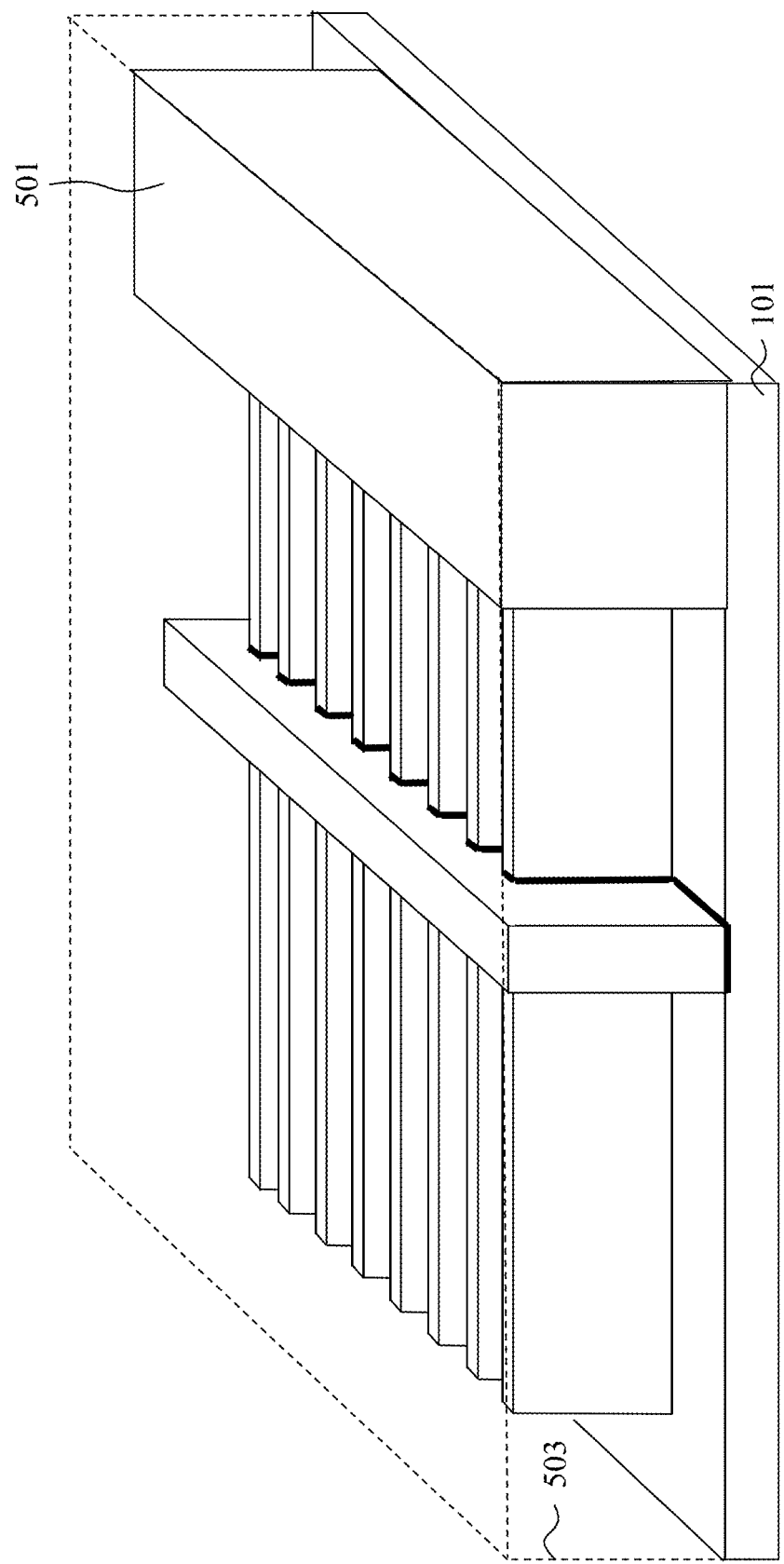
FIG. 5 illustrates a formation of a contact, in accordance with some embodiments.

FIG. 5 illustrates a formation of a contact 501 to the fins 301. In an embodiment the contact 501 is formed by initially forming an inter-layer dielectric (ILD) 503 (represented in a dashed form in FIG. 5 for clarity) over the fins 301. The ILD 503 may be formed by chemical vapor deposition, sputtering, or any other methods known and used in the art for forming an ILD. The ILD 503 typically has a planarized surface and may be comprised of silicon oxide, although other materials, such as high-k materials, could alternatively be utilized.

Once the ILD 503 has been formed, the contacts 501 may be formed in the ILD 503 in accordance with photolithography and etching techniques. In an embodiment the photolithography techniques involve depositing a photoresist material, which is masked, exposed, and developed to expose portions of the ILD 503 that are to be removed. The remaining photoresist material protects the underlying material from subsequent processing steps, such as etching. The photoresist material is utilized to create a patterned mask to define the contacts 501. The etching process may be an anisotropic or isotropic etch process, such as an anisotropic etch process. In an embodiment, the etch process is continued until at least an upper surface of the fins 301 are exposed and may be continued until an upper surface of the substrate 101 is exposed. Additionally, sidewalls of the fins 301 at the edges (e.g., the end sidewalls of the fins 301) may or may not be exposed. Contacts 501 are then formed so as to contact the exposed surfaces of the fins 301.

The contacts 501 may be formed of any suitable conductive material, such as a highly-conductive, low-resistive metal, elemental metal, transition metal, metallic nitride, metallic or conductive oxide, or the like. In an embodiment the contacts 501 are formed of tungsten, although other materials, such as copper, scandium, titanium, nickel, platinum, or the like could alternatively be utilized. In an embodiment in which the contacts 501 are formed of tungsten, the contacts 501 may be deposited by, e.g., CVD, although any method of formation could alternatively be used.

By utilizing the TMD layer 103 to form the fins 301 which are then utilized to form field effect transistors, high density field effect transistors having a transition metal dichalcogenide channel material may be formed, where the drive current per unit wafer area or device footprint is maximized.

Figure 6A:
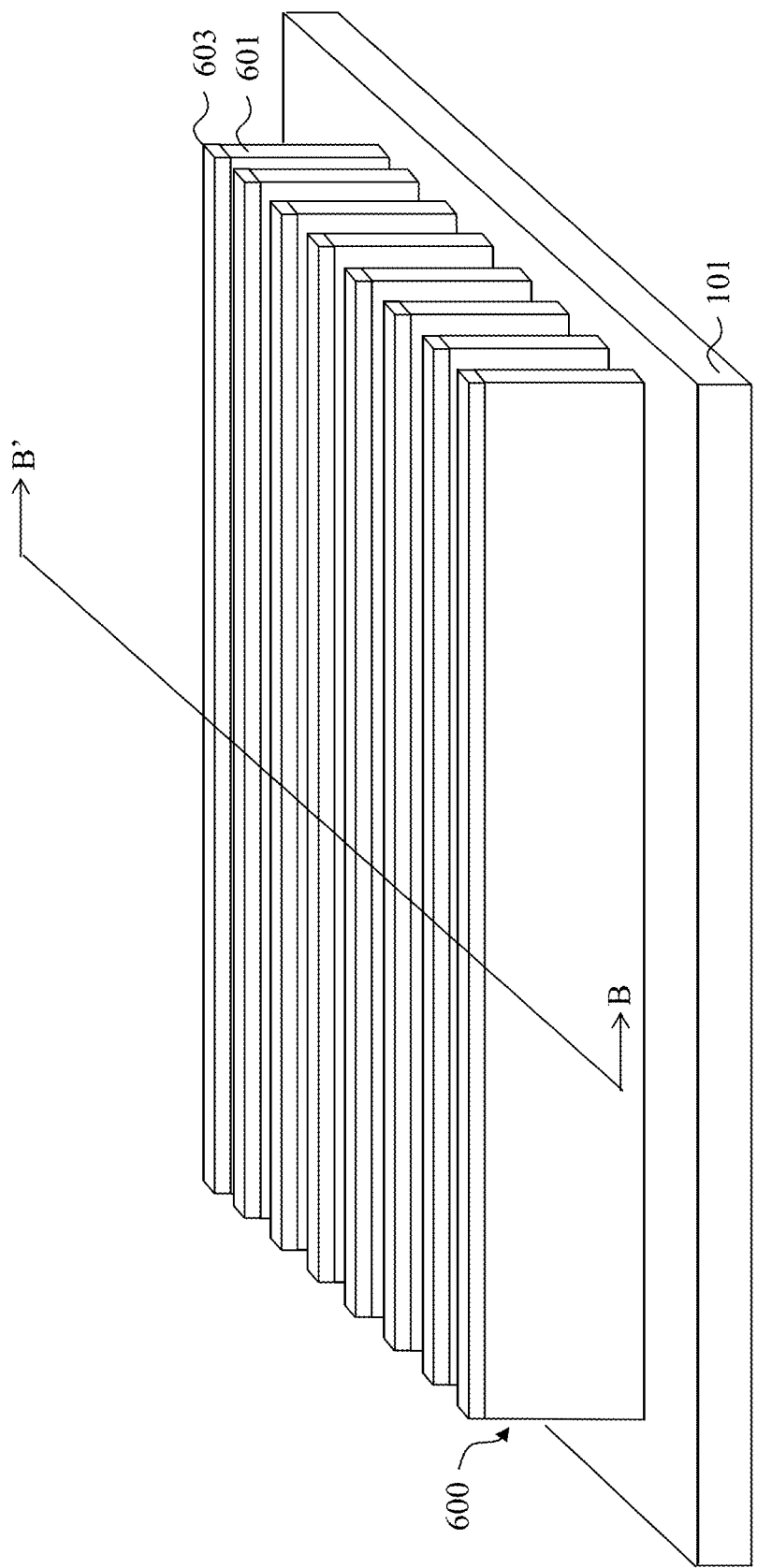
FIGS. 6A-6B illustrate a patterning of a non-TMD material with a hard mask, in accordance with some embodiments.
Figure 6B:
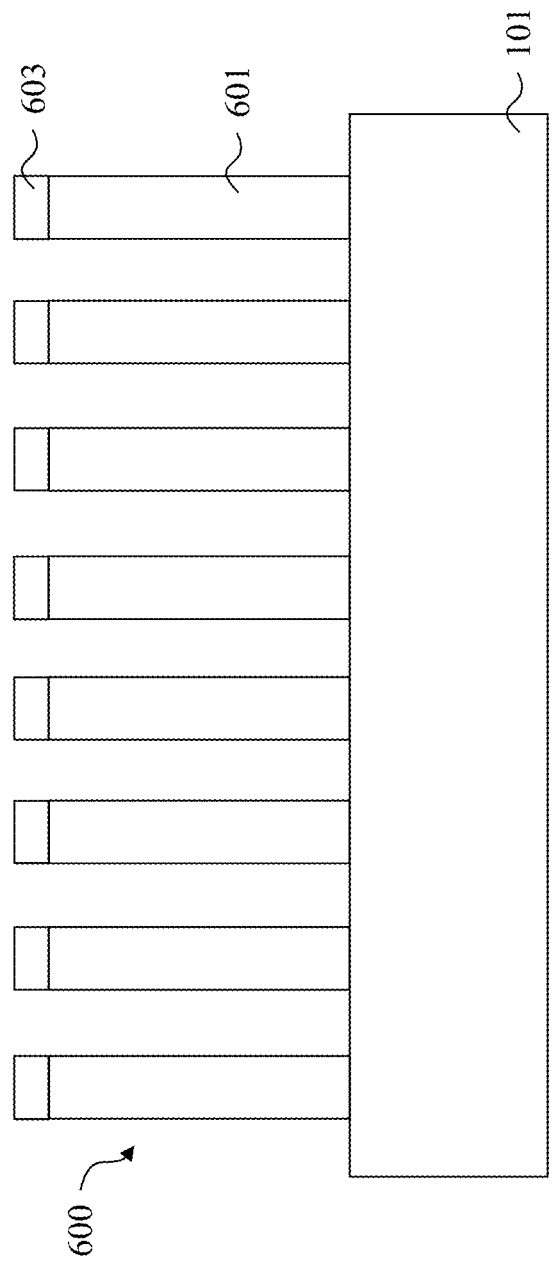

FIGS. 6A-6B illustrate another embodiment in which second fins 600 that comprise multiple TMD sheets 701 (not illustrated within FIGS. 6A-6B but illustrated and discussed further below with respect to FIGS. 7A-7B) that sandwich a layer of non-TMD material 601 are formed (with FIG. 6B being a cross-section view of FIG. 6A along line B-B'). In this embodiment the layer of the non-TMD material 601 may be a precursor material that will be used in a later process to form the multiple TMD sheets 701. In a particular example the non-TMD material 601 may be a precursor such as molybdenum (Mo) or tungsten (W). Alternatively, the non-TMD material 601 may comprise a non-conductive dielectric material that can provide an initial material for conversion into the TMD sheets 701, such as $MoO_3$. However, any other suitable material or method of manufacture may alternatively be utilized. The non-TMD material 601 may be formed using any suitable deposition process, such as CVD, PVD, ALD, or the like.

Once the layer of the non-TMD material 601 has been formed, a hard mask 603 may be formed over the non-TMD material 601. In an embodiment the hard mask 603 comprises a hard mask material such as silicon nitride, oxides, oxynitrides, silicon carbide, combinations of these, or the like. The hard mask material may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combination are fully intended to be included within the scope of the embodiments. The hard mask material may be formed to a thickness of between about 100 Å and about 800 Å, such as about 300 Å.

Once the hard mask material has been formed, the hard mask material may be patterned into the hard mask 603 using, e.g., a photolithographic masking and etching process. In such a process, a photosensitive material (not separately illustrated in FIGS. 6A-6B) is initially placed on the hard mask material and then exposed to a patterned energy source such as light. The photosensitive material is then developed by, e.g., separating the exposed portion of the photosensitive material and the unexposed portion of the photosensitive material to form a patterned photoresist. The patterned photoresist is then utilized as a mask during an anisotropic etching process, whereby portions of the hard mask material that are exposed by the patterned photoresist are removed, thereby patterning the underlying hard mask material into the shape of the patterned photoresist and forming the hard mask 603.

Once the hard mask 603 has been formed, the hard mask 603 and, optionally, the patterned photoresist if it has not been removed, are utilized to pattern the underlying layer of the non-TMD material 601 and form the second fins 600. In an embodiment the layer of the non-TMD material 601 is patterned using an anisotropic dry etching process such as a reactive ion etch that removes exposed portions of the layer of the non-TMD material 601 and form the second fins 600 through the hard mask 603.

Additionally, during the etching process, the parameters of the etch are set in order to form sidewalls that are perpendicular or mostly perpendicular to the substrate 101. In order to achieve this orientation, the second fins 600 may be etched using etching parameters specific to forming perpendicular sidewalls. For example, in an embodiment in which the non-TMD material 601 is molybdenum, the non-TMD material 601 may be etched using a reactive ion etch (RIE) process in which the slope can be controlled by controlling the ratios of the mixtures within the precursor gases. In particular, because fluorine atoms react rapidly with molybdenum, precursors using chlorine may be utilized in order to produce more anisotropic profiles. As such, a more vertical and perpendicular profile can be achieved by using a precursor such as chlorine ($Cl_2$). In an embodiment, the chlorine flow rate may be about 100 sccm, the process pressure may be performed at about 200 mtorr, and the process temperature may be performed at about 130° C. However, any suitable process for etching the non-TMD material 601 with perpendicular sidewalls, such as by using a mixture of chlorine and oxygen (with the oxygen at a concentration of up to 30%), such as those described within Fischl, D. S., *Molybdenum Etching with Chlorine Atoms and Molecular Chlorine Plasmas*, Journal of Vacuum Science and Technology B 6, 1577 (1988) (hereinafter "Fischl"), which reference is hereby incorporated herein by reference, may be utilized.

In another embodiment, if the fins 301 (e.g., molybdenum) are desired to be formed with sloped sidewalls, the non-TMD material 601 may be etched with modified parameters. For example, whereby the parameters as described above may be utilized to form the fins 301 with sidewalls that are relatively perpendicular to the substrate 101, to achieve the sloped sidewalls for the sloped fins 1101, the parameters are modified from the parameters described above. In particular, the precursors used for the RIE process may be modified to other parameters as described in Fischl. In an embodiment, a mixture of $CF_4/O_2$; $CF_3Cl/O_2$; or $CF_2Cl_2/O_2$ at a total flow rate of between about 100 sccm and 200 sccm may be used to obtain sloped sidewalls, although any suitable etching parameters that can form sloped sidewalls, or other methods of formation, may also be used.

In yet another embodiment the parameters may be set as described in Kuo, Yue, *Slope Control of Molybdenum Lines Etched with Reactive Ion Ethcing*, Journal of Vacuum Science Technology A 8(3), May/June 1990, which reference is incorporated herein by reference. In this embodiment the sloped sidewalls may be obtained using an etchant such as $CF_4/O_2$, although any suitable etchant or mixture of etchants may be used. Additionally as examples of this embodiment, the etching process may utilize a power density of 0.43 W/cm$^2$ at 1000 W. However, any suitable process parameters may be utilized.

Figure 7A:
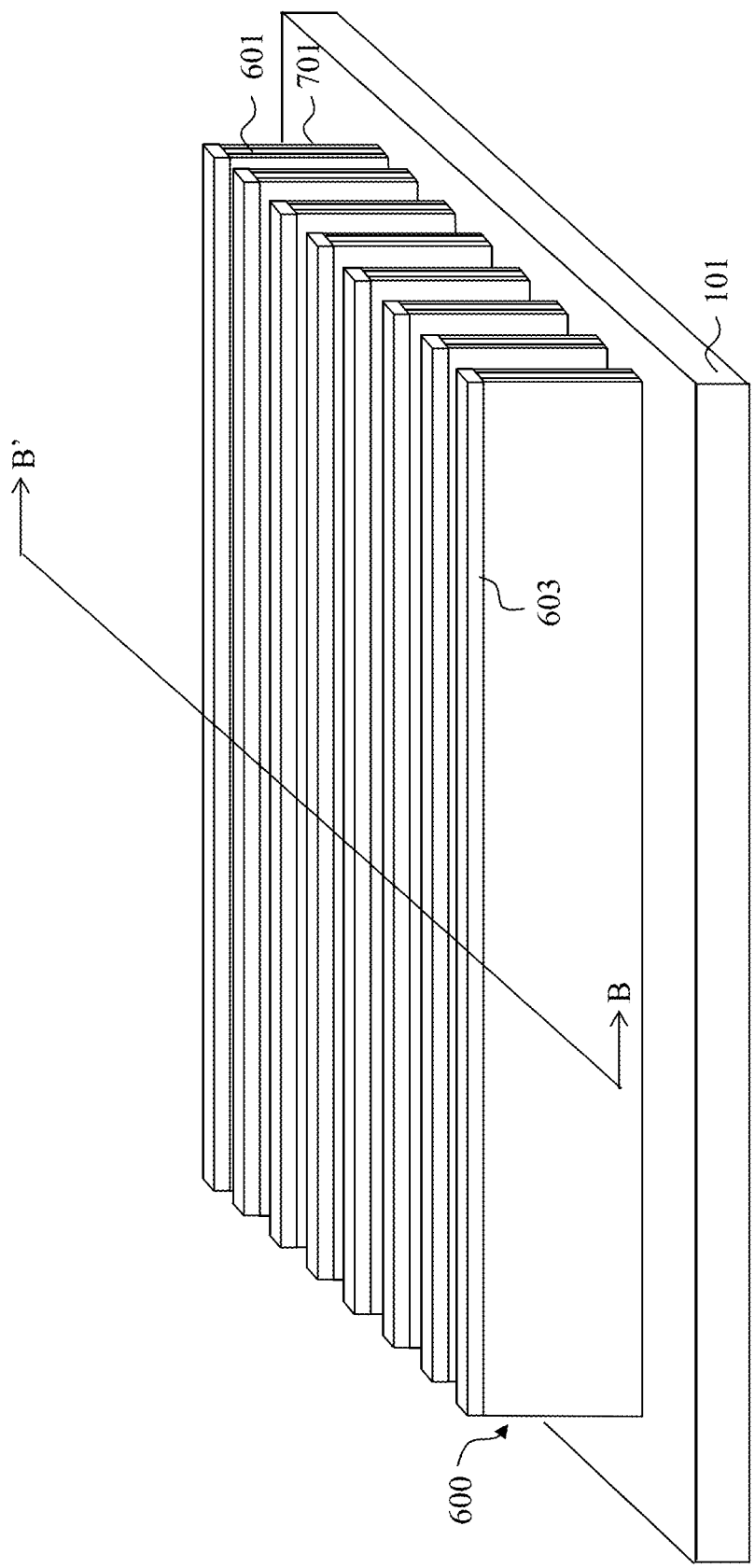
FIGS. 7A-7C illustrate a formation of TMD sheets, in accordance with an embodiment.
Figure 7B:
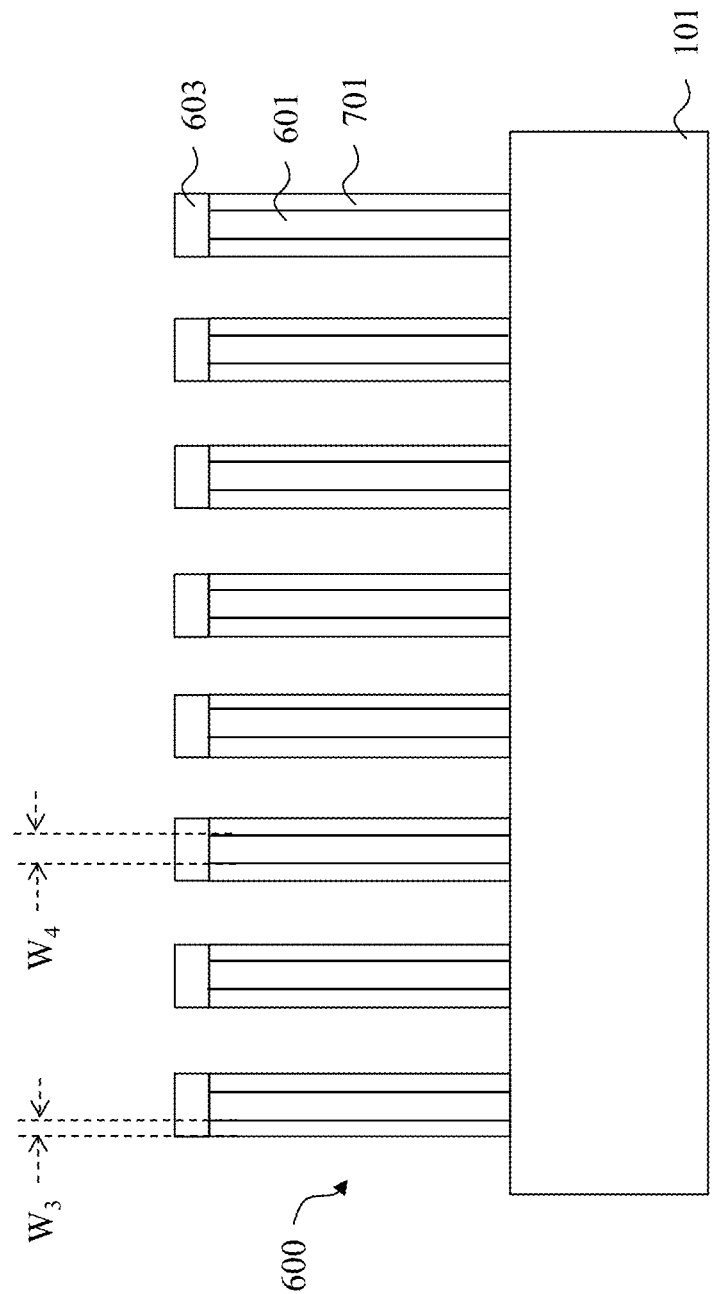

FIGS. 7A-7B illustrate a formation of the TMD sheets 701 (e.g., $MoS_2$) from the non-TMD material 601 (e.g., Mo) within the second fins 600 while the hard mask 603 remains on the second fins 600 (with FIG. 7B being a cross-section view of FIG. 7A along line B-B'). In an embodiment the TMD sheets 701 may be formed using, e.g., the reaction chamber 107 and a modified process as described above with respect to FIG. 1C, as described in Zhan. For example, the substrate 101, the second fins 600, and the hard mask 603 are placed face down over the first crucible 105 (without a separate first precursor material 111 as the non-TMD material 601 such as molybdenum acts as the first precursor material 111 and is already present as part of the second fins 600). The second precursor material 119 (which is still referred to as the "second" precursor material even though it is the only material being moved to the substrate 101 as the non-TMD material 601 is already present and acts as the first precursor material 111, and which may be e.g., sulfur for a sulfurization process or selenium for a selenization process) may be placed within the first crucible 111 (with the second crucible 113 either empty or removed completely), and the first crucible 105 may be placed within the housing 109 of the reaction chamber 107.

Once in place inside the reaction chamber 107, the reaction chamber 107 may be initially purged in order to remove any undesired impurities from the reaction chamber 107. In an embodiment in which the non-TMD material is molybdenum and the second precursor material 119 is sulfur, the purge may be performed by flowing nitrogen ($N_2$) or argon through the reaction chamber at a flow rate of between about 150 sccm and about 200 sccm for about 15 minutes. However, any suitable method of purging may alternatively be utilized. Once purged, the flow of the non-reactive gas may be reduced so that the non-reactive gas may be used as a carrier gas for the reaction. In an embodiment the carrier gas may be reduced to a steady flow of about 5 sccm.

After the reaction chamber 107 has been purged, the temperature of the reaction chamber 107 is increased to a desired reaction temperature. In a particular embodiment in which the non-TMD material 601 is molybdenum and the second precursor material 119 is sulfur, the temperature is increased in stages, with an initial rate of temperature increase increasing the reaction chamber 107 from room temperature to about 500° C. in about 30 minutes. Next, the temperature is increased to the desired reaction temperature of between about 500° C. and about 1000° C., such as about 750° C. in about 90 minutes.

Once the desired reaction temperature has been reached, the temperature of the reaction chamber 107 is maintained at about 750° C. in order to react the second precursor material 119 (e.g., sulfur which has turned into a vapor and been transported from the first crucible 105 to the substrate 101) with the exposed portions of the layer of non-TMD material 601 (e.g., Mo) and form the TMD sheets 701 (e.g., $MoS_2$) from the material within the non-TMD material 601 (e.g., Mo). In an embodiment the thickness of the TMD sheets 701 will depend at least in part upon the time of reaction between the non-TMD material 601 and the second precursor material 119. However, in an embodiment the TMD sheets 701 may be formed to a third width $W_3$ of between about 7 Å and about 140 Å, such as about 50 Å, by leaving the temperature at about 750° C. for a time of between about 1 minute and about 10 hours, such as about 10 minutes, such that the non-TMD material 601 remaining between the TMD sheets 701 has a fourth width $W_4$ of between about 7 Å and about 700 Å. However, any suitable time and thickness may alternatively be utilized.

Finally, once the TMD sheets 701 have reached a desired width, such as the third width $W_3$, the reaction may be halted. In an embodiment the reaction may be halted by cooling the reaction chamber 107 down to room temperature. In a particular embodiment the reaction chamber 107 and, hence, the TMD sheets 701 (e.g., $MoS_2$), the non-TMD material 601 (e.g., Mo) and the substrate 101 may be cooled to room temperature using a controlled cooling by reducing the temperature to room temperature in about 120 minutes. However, any suitable reduction in temperature may alternatively be utilized.

By initially depositing the non-TMD material 601 and then modifying a portion of the non-TMD material 601 to form the TMD sheets 701, a portion of the non-TMD material 601 may be left in the middle of the second fins 600. This material may then be used to provide additional mechanical support for the TMD material within the TMD sheets 701.

Alternatively, if desired, the reaction may be continued so that the non-TMD material 601 may be fully transformed into TMD materials instead of leaving the non-TMD material 601 between the TMD sheets 701. For example, in this embodiment the reaction may be continued for a time of between about 1 minute and about 10 hours, such as about 10 minutes. In this embodiment the reaction may be used as an alternative method to form the fins 301. Additionally, the hard mask 603 may be removed either before or after the reaction, or may alternatively be left onto the fins 301 after formation.

Figure 7C:
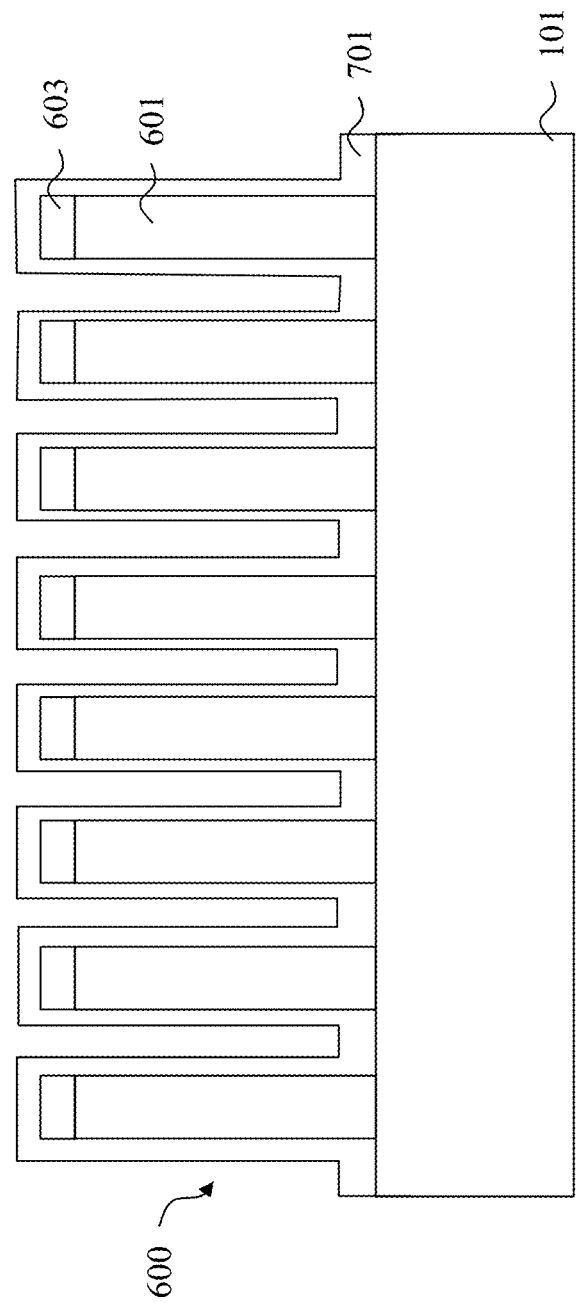

FIG. 7C illustrates yet another embodiment in which the non-TMD material 601 may not be an initial precursor for the TMD sheets 701, but may instead be a material that provides mechanical support for the TMD sheets 701 once the TMD sheets 701 have been formed. In this embodiment the non-TMD material 601 may be a dielectric such as aluminum oxide, silicon oxide, or other dielectrics, or may be a semiconductor material having a substantial band gap, such as silicon, gallium arsenide, or the like. In this embodiment, once the non-TMD material 601 has been deposited, the TMD sheets 701 may be deposited using, e.g., the direct deposition process described above with respect to FIGS. 1A-1B. However, because the deposition process is performed with the presence of the hard mask 603, the material deposited by the direct deposition process will deposit along the sidewalls of the non-TMD material 601 and the surfaces of the hard mask material 603.

Figure 8A:
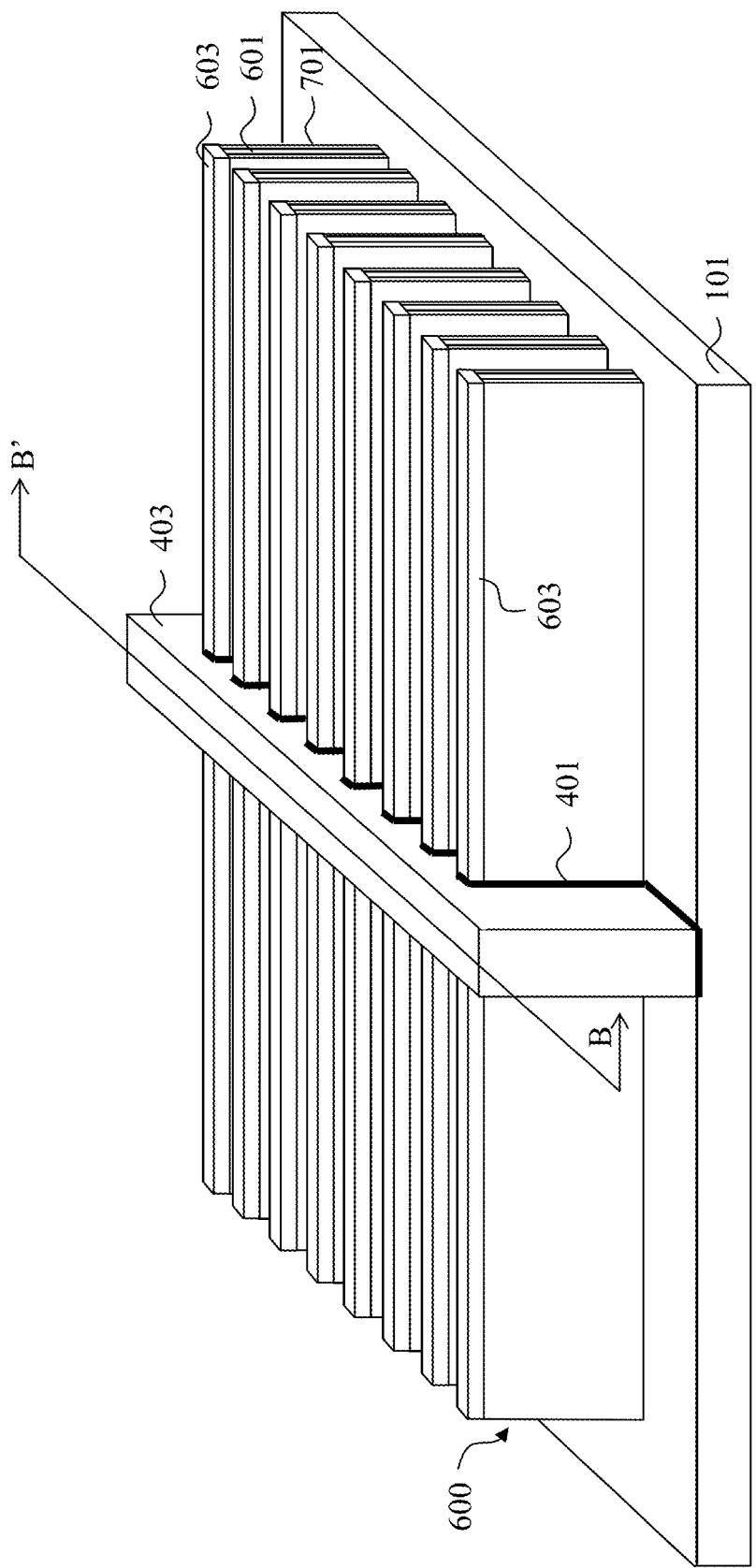
FIGS. 8A-8B illustrate a formation of a gate dielectric and a gate electrode over the TMD sheets, in accordance with some embodiments.
Figure 8B:
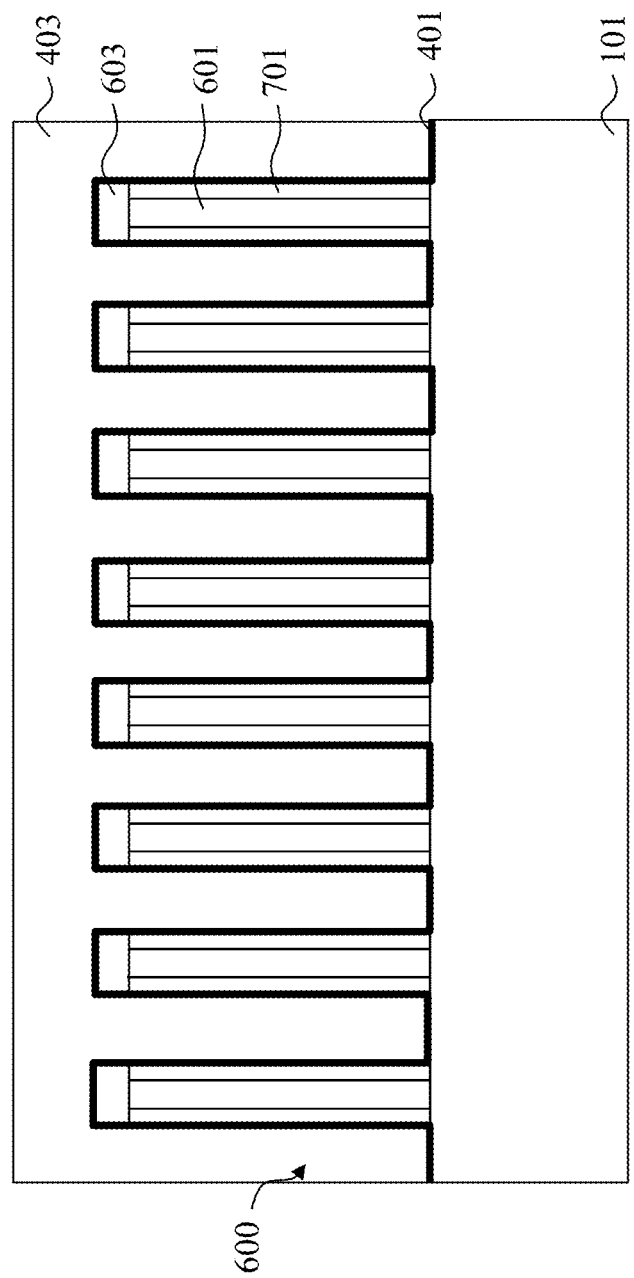

FIGS. 8A-8B illustrate a formation of the gate dielectric 401 and the gate electrode 403 over the non-TMD material 601, over the TMD sheets 701, and over the hard mask 603 (with FIG. 8B being a cross-section view of FIG. 8A along line B-B'). In an embodiment the gate dielectric 401 and the gate electrode 403 may be formed as described above with respect to FIGS. 4A-4B. However, the gate dielectric 401 and the gate electrode 403 may be formed in any suitable fashion.

Additionally, while not specifically illustrated in FIGS. 8A-8B for clarity, other methods may be utilized to finish the device, such as by forming the source/drain regions 407 and forming the contact 501 in electrical connection with the TMD sheets 701. In this embodiment the source/drain regions 407 may be formed as described above with respect to FIGS. 4A-4B and the contact 501 may be formed as described above with respect to FIG. 5. For example, the ILD 503 may be initially deposited and then the contacts 501 may be formed within openings formed within the ILD 503 in order to make physical or electrical contact with the TMD sheets 701. However, any suitable methods may alternatively be utilized.

Figure 9:
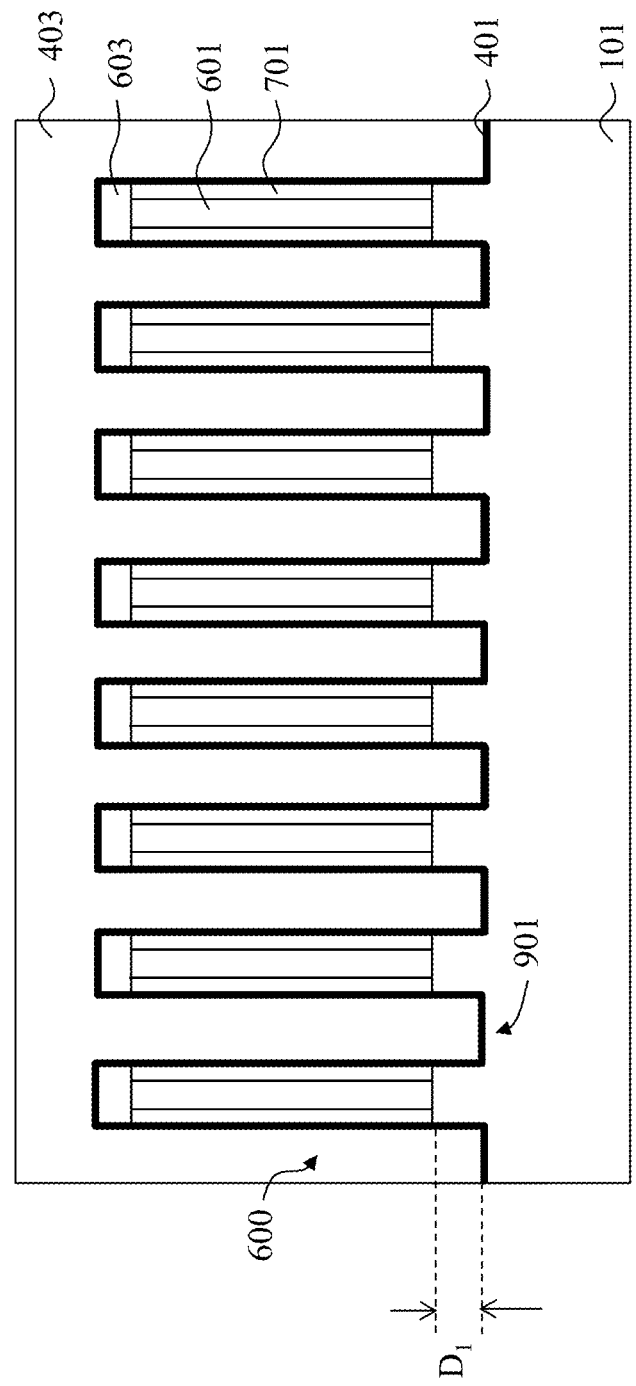
FIG. 9 illustrates a formation of recesses within the substrate, in accordance with some embodiments.

FIG. 9 illustrates another embodiment in which, instead of using the hard mask 603 to pattern only the non-TMD material 601, the hard mask 603 is utilized to pattern the non-TMD material 601 as well as to form recesses 901 within the substrate 101. In an embodiment in which the etchant utilized to pattern the non-TMD material 601 is also suitable to pattern the substrate 101, the etching process utilized to pattern the non-TMD material 601 (as described above with respect to FIGS. 6A-6B) may simply be extended in order to form the recesses 901.

Alternatively, in an embodiment in which the etchants utilized to pattern the non-TMD material 601 is selective to the non-TMD material 601 and is not suitable for also etching the material of the substrate 101, a second etch process may be used. For example, once the non-TMD material 601 has been patterned using, e.g., the method as described above with respect to FIGS. 6A-6B, then a second etch process, such as an anisotropic etch with etchants selective to the material of the substrate 101, may be utilized to form the recesses 901. As such, the recesses are formed using the hard mask 603 and the non-TMD material 601 as masks, thereby aligning sidewalls of the recesses 901 with the non-TMD material 601.

In an embodiment the recesses 901 are formed to extend into the substrate 101 a first depth $D_1$ of between about 1 nm and about 20 nm, such as about 5 nm. Once the recesses 901 have been formed, the TMD sheets 701 may be formed, the gate dielectric 401 may be deposited, and the gate electrode 403 may be formed. The TMD sheets 701, the gate dielectric 401 and the gate electrode 403 may be formed described above with respect to FIGS. 7A-8B. Additionally, while not specifically illustrated in FIG. 9 for clarity, other methods may be utilized to finish the device, such as by forming the source/drain regions 407 and forming the contact 501 in electrical connection with the TMD sheets 701. In this embodiment the source/drain regions 407 may be formed as described above with respect to FIGS. 4A-4B and the contact 501 may be formed as described above with respect to FIG. 5. For example, the ILD 503 may be initially deposited and then the contacts 501 may be formed within openings formed within the ILD 503 in order to make physical or electrical contact with the TMD sheets 701. However, any suitable methods may alternatively be utilized.

By forming the recesses 901 into the substrate 101, a better control of short-channel effects can be achieved in the final device. In particular, the gate control of the potential at the bottom of the TMD sheets 701 is enhanced or increased by forming the gate dielectric 401 and the gate electrode 403 within the recesses 901 adjacent to the TMD sheets 701. Additionally, such recesses 901, while only illustrated within FIG. 9 for clarity, may also be utilized within any of the other embodiments described herein.

Figure 10B:
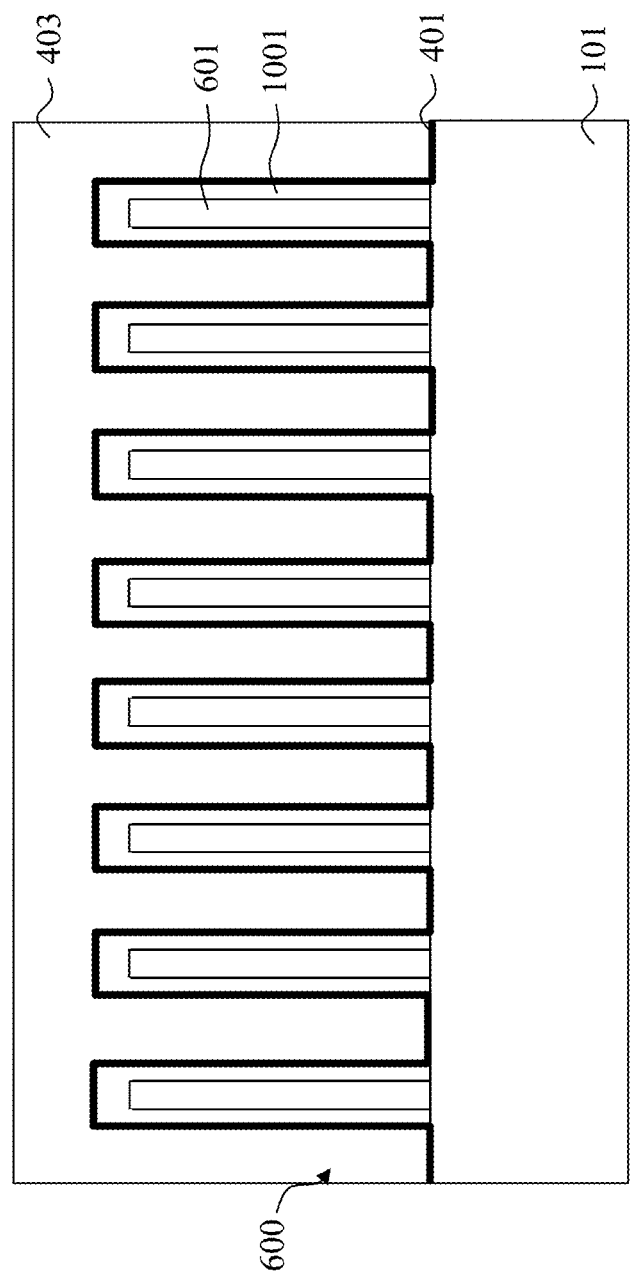

FIGS. 10A-10B illustrate yet another embodiment similar to the embodiment described in FIGS. 6A-8B, but in which the hard mask 603 is removed after the patterning of the non-TMD material 601 and before the formation of the TMD sheets 701 (with FIG. 10B being a cross-section view of FIG. 10A along line B-B'). In an embodiment the hard mask 603 is removed after the patterning of the non-TMD material 601 by performing, e.g., a wet etch process with an etchant selective to the material of the hard mask 603 that will not appreciably remove the non-TMD material 601. Once the hard mask 603 has been removed, a second TMD layer 1001 may be formed from the non-TMD material 601 along an outer perimeter of the non-TMD material 601. In an embodiment the second TMD layer 1001 may be formed in a similar fashion as the TMD sheets 701 described above with respect to FIGS. 7A-7B. For example, the non-TMD material 601 (after it has been patterned into the second fins 600) may be placed (along with the substrate 101) into the reaction chamber 107 and the second precursor material 119 may be utilized to transform an exposed portion of the non-TMD material 601 into the second TMD layer 1001.

However, without the presence of the hard mask 603 along the top surface of the non-TMD material 601, the non-TMD material 601 that was previously covered by the hard mask 603 is now exposed and will also react with the second precursor material 119 to form TMD material. As such, the second TMD layer 1001 is formed along the top surface of the non-TMD material 601 as well as along the exposed sidewalls of the non-TMD material 601. As such, a continuous layer of TMD material is formed along the outer perimeter of the non-TMD material 601, and the second TMD layer 1001 is formed.

FIGS. 10A-10B additionally illustrate a formation of the gate dielectric 401 and the gate electrode 403 over the non-TMD material 601 and over the second TMD layer 1001. In an embodiment the gate dielectric 401 and the gate electrode 403 may be formed as described above with respect to FIGS. 4A-4B. However, the gate dielectric 401 and the gate electrode 403 may be formed in any suitable fashion. Additionally, while not specifically illustrated in FIGS. 10A-10B for clarity, other methods may be utilized to finish the device, such as by forming the source/drain regions 407 and forming the contact 501 in electrical connection with the second TMD layer 1001. In this embodiment the source/drain regions 407 may be formed as described above with respect to FIGS. 4A-4B and the contact 501 may be formed as described above with respect to FIG. 5. For example, the ILD 503 may be initially deposited and then the contacts 501 may be formed within openings formed within the ILD 503 in order to make physical or electrical contact with the second TMD layer 1001. However, any suitable methods may alternatively be utilized.

Figure 11A:
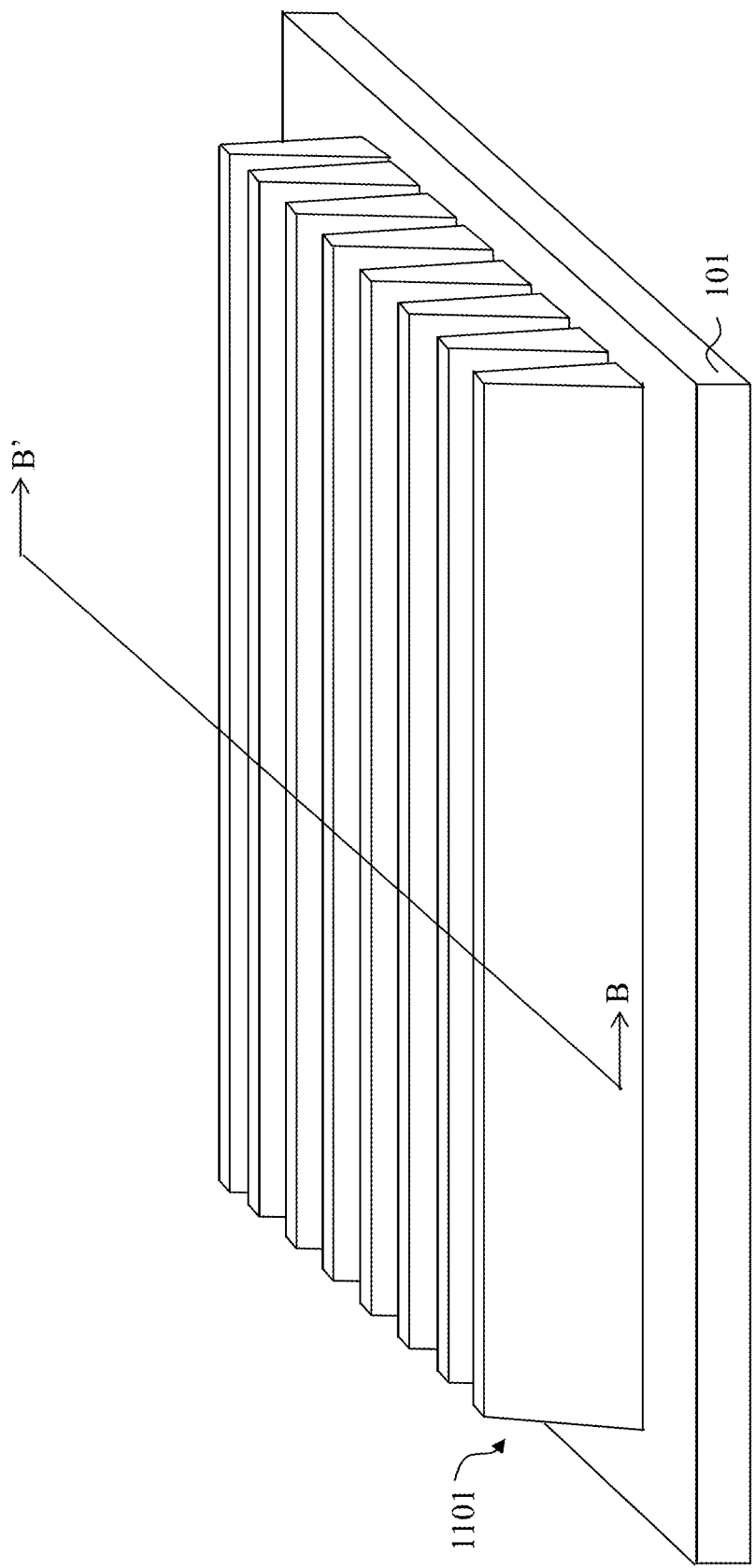
FIGS. 11A-11B illustrate a formation of sloped fins, in accordance with an embodiment.
Figure 11B:
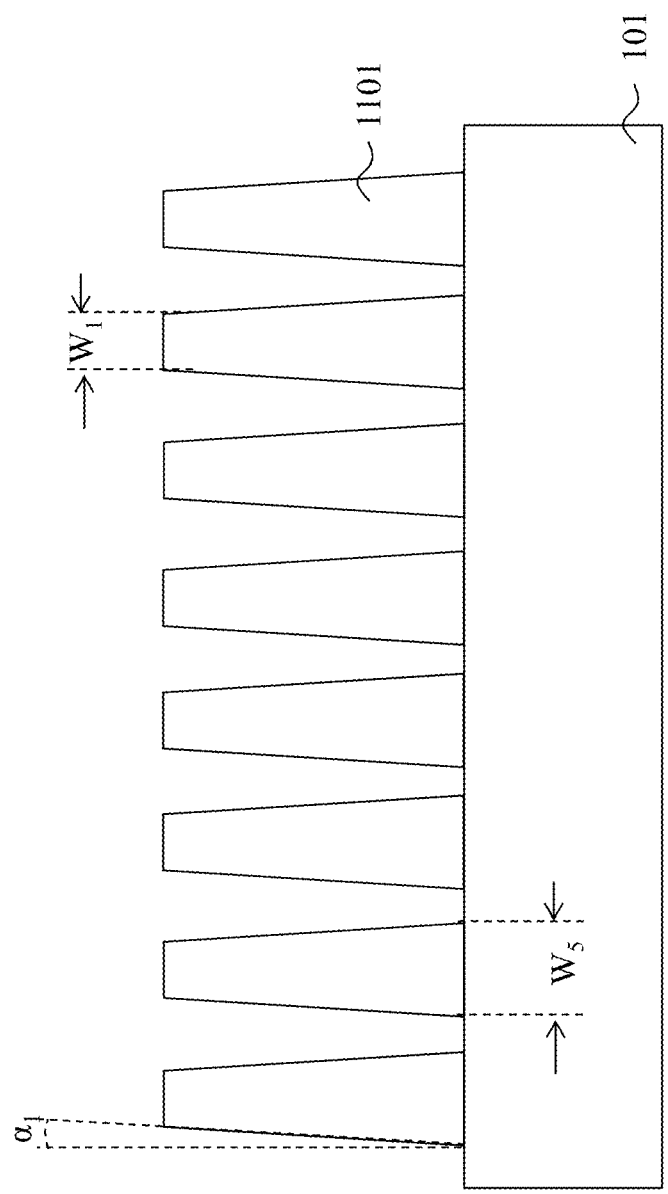

FIGS. 11A-11B illustrate yet another embodiment in which the TMD layer 103 (not separately illustrated in FIGS. 11A-11B) are patterned into sloped fins 1101 that have sloping sidewalls that are not perpendicular with the substrate 101 (with FIG. 11B being a cross-section view of FIG. 11A along line B-B'). In an embodiment the sloped fins 1101 may be formed to have the first width $W_1$ at a top of the sloped fin 1101, such as being between about 6 Å and about 70 Å, and may be patterned to have a fifth width $W_5$ at the bottom of the sloped fin 1101 of between about 1 nm and about 12 nm, such as about 6 nm.

In an embodiment the sloped fins 1101 may be formed by an etching process to directly form the sloped fins 1101. For example, in an embodiment the sloped fins 1101 may be formed by initially patterning the non-TMD material 601 (e.g., molybdenum) prior to modifying the non-TMD material 601 into the TMD sheets 701 (as described above with respect to FIGS. 6A-7C). In a particular embodiment in which the non-TMD material 601 is molybdenum, a mixture of $CF_4/O_2$; $CF_3Cl/O_2$; or $CF_2Cl_2/O_2$ at a total flow rate of between about 100 sccm and 200 sccm may be used as described in Fischl to obtain sloped sidewalls, although any suitable etching parameters that can form sloped sidewalls and the sloped fins 1101, or other methods of formation, may also be used. Once the sloped sidewalls have been formed, the TMD sheets 701 may be formed from the non-TMD material 601 using, for example, the process described above with respect to FIGS. 7A-7C, although any suitable method may be utilized.

Figure 12A:
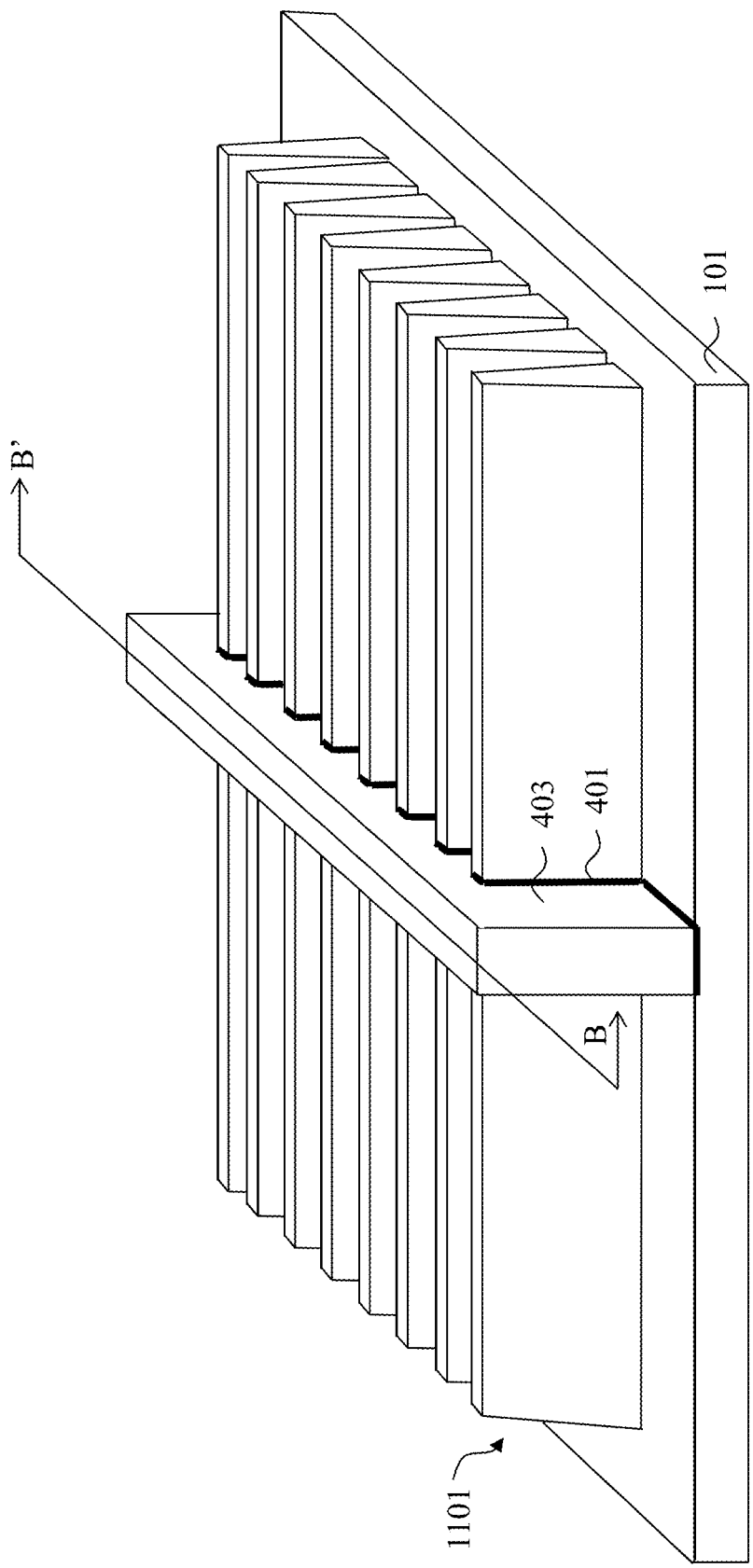
FIGS. 12A-12B illustrate a formation of a gate dielectric and a gate electrode over the sloped fins, in accordance with some embodiments.
Figure 12B:
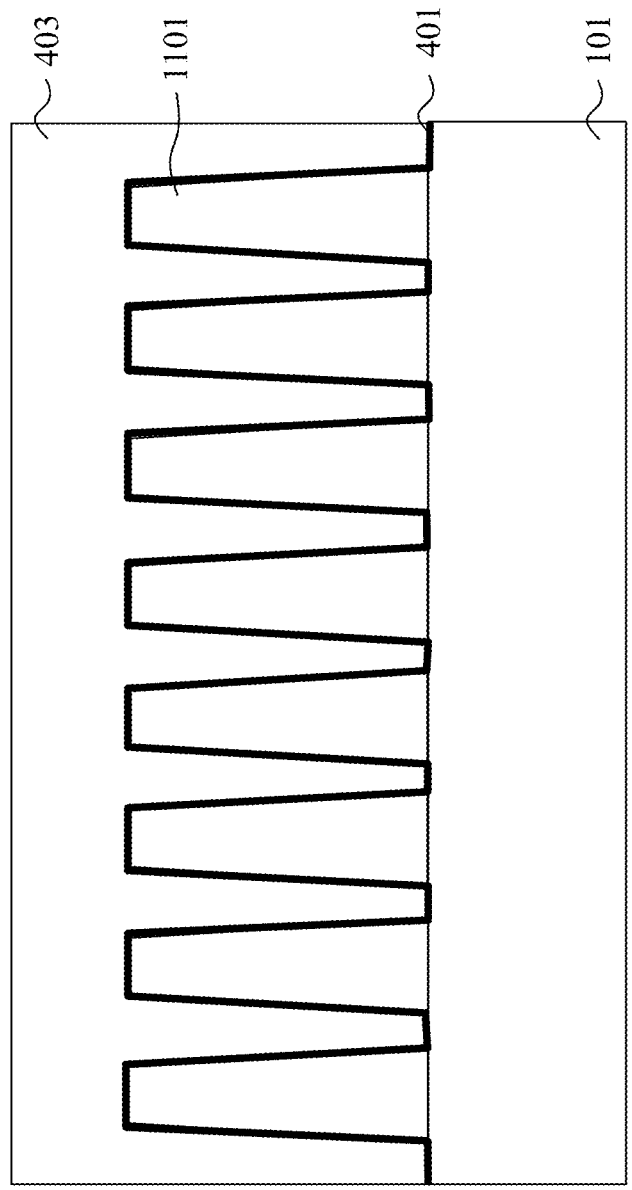

FIGS. 12A-12B illustrate a formation of the gate dielectric 401 and the gate electrode 403 over the sloped fins 1101 which now comprise the TMD sheets 701 (with FIG. 12B being a cross-section view of FIG. 12A along line B-B'). In an embodiment the gate dielectric 401 and the gate electrode 403 may be formed as described above with respect to FIGS. 4A-4B. However, the gate dielectric 401 and the gate electrode 403 may be formed in any suitable fashion. Additionally, while not specifically illustrated in FIGS. 12A-12B for clarity, other methods may be utilized to finish the device, such as by forming the source/drain regions 407 and forming the contact 501 in electrical connection with the sloped fins 1101. In this embodiment the source/drain regions 407 may be formed as described above with respect to FIGS. 4A-4B and the contact 501 may be formed as described above with respect to FIG. 5. For example, the ILD 503 may be initially deposited and then the contacts 501 may be formed within openings formed within the ILD 503 in order to make physical or electrical contact with the sloped fins 1101. However, any suitable methods may alternatively be utilized.

Figure 13A:
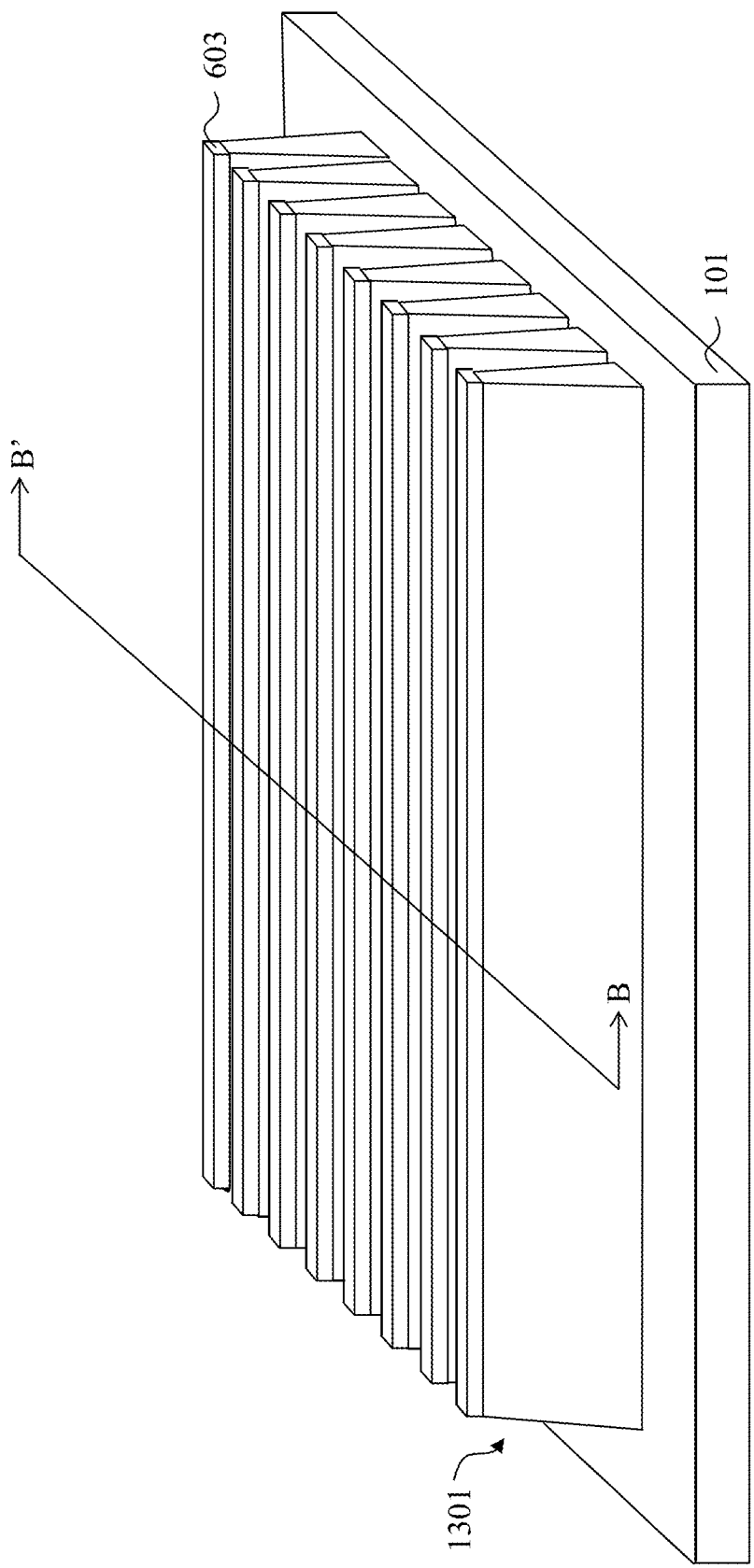
FIGS. 13A-13B illustrate a formation of sloped non-TMD material, in accordance with some embodiments.
Figure 13B:
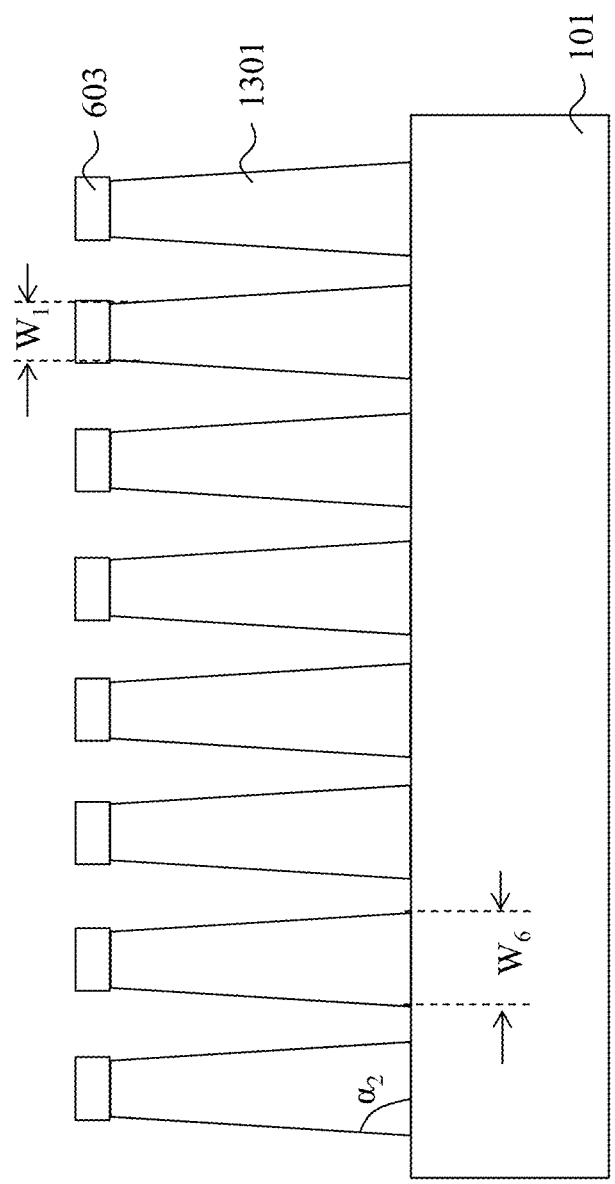

FIGS. 13A-13B illustrate another embodiment similar to the embodiment described above with respect to FIGS. 6A-10B, but in which the second TMD layer 1001 is formed over the non-TMD material 601 after the non-TMD material 601 has been formed to have sloped sidewalls (with FIG. 13B being a cross-section view of FIG. 13A along line B-B'). In an embodiment the non-TMD material 601 may be initially deposited as described above with respect to FIGS. 6A-6B. Once formed, the non-TMD material 601 may then be patterned using, e.g., an anisotropic etching process to form sloped non-TMD fins 1301 with the first width $W_1$ of between about 6 Å and about 70 Å, at the top of the sloped non-TMD fins 1301 and a sixth width $W_6$ larger than the first width $W_1$ at the bottom of the sloped non-TMD fins 1301 of between about 1 nm and about 12 nm, such as about 6 nm.

In this embodiment in which the non-TMD material 601 is used as support structure (e.g., when the non-TMD material 601 is silicon oxide), the sloped non-TMD fins 1301 may be formed by etching. In an embodiment in which the non-TMD material 601 is silicon oxide, the non-TMD material 601 may be etched into a sloped shape prior to deposition of the TMD sheet 701 as described in Westerheim, A. C., *Substrate Bias Effects in High-Aspect-Ratio SiO2 Contact Etching Using an Inductively Coupled Plasma Reactor*, Journal of Vacuum Science Technology, A 13(3), May/June 1995 (hereinafter "Westerheim"), which reference is hereby incorporated herein by reference. For example, the silicon oxide may be etched using an etchant such as $C_2F_6$ at a flow rate of about 30 sccm, with a power source of 2800 W, a pressure of about 2.2 mTorr, and a wafer bias of between about 400 W and about 800 W. However, any suitable process may be used.

In another embodiment in which the non-TMD material 601 is used as both a support structure and a precursor to form the TMD layer 1001 (e.g., $MoO_3$), the sloped non-TMD fins 1301 may also be formed using an etching process. In this embodiment, the etching process may use parameters as described in Zeng, H. C., *Manipulation of Catalyst Structure for Molybdenum Trioxide by Chemical Etching*, Mat. Res. Soc. Sump. Proc. Vol. 549, pp. 199-204 (1999), which reference is incorporated herein by reference. For example, in an embodiment in which the non-TMD material 601 is $MoO_3$, a 0.1 M NaOH aqueous solution may be applied to the non-TMD material 601 at room temperature for a time period of greater than 40 seconds and then rinsed with deionized water. However, any suitable process or parameters may be used to form the non-TMD fins 1301.

Figure 14A:
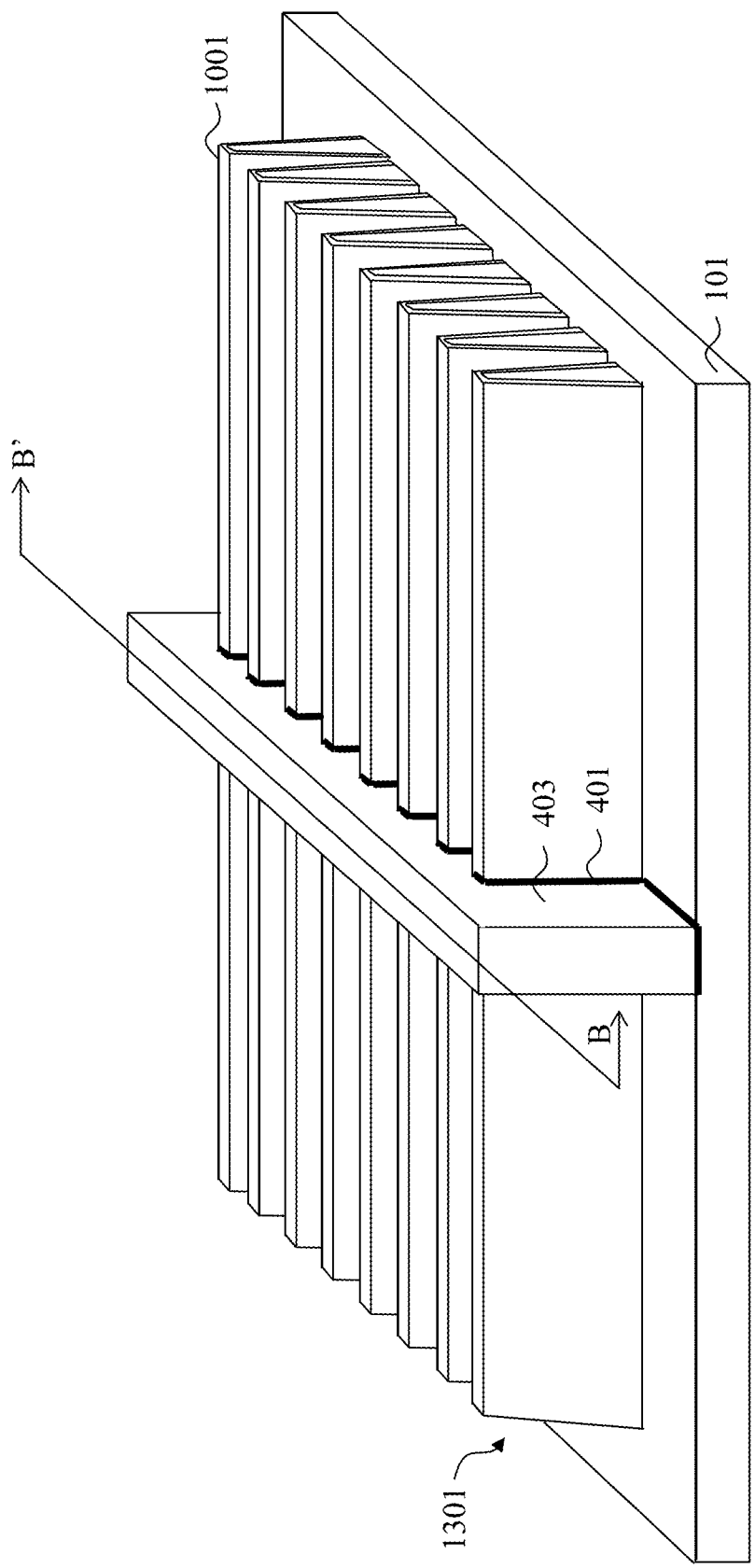
FIGS. 14A-14B illustrate a formation of the second TMD layer from the sloped non-TMD material, in accordance with some embodiments.
Figure 14B:
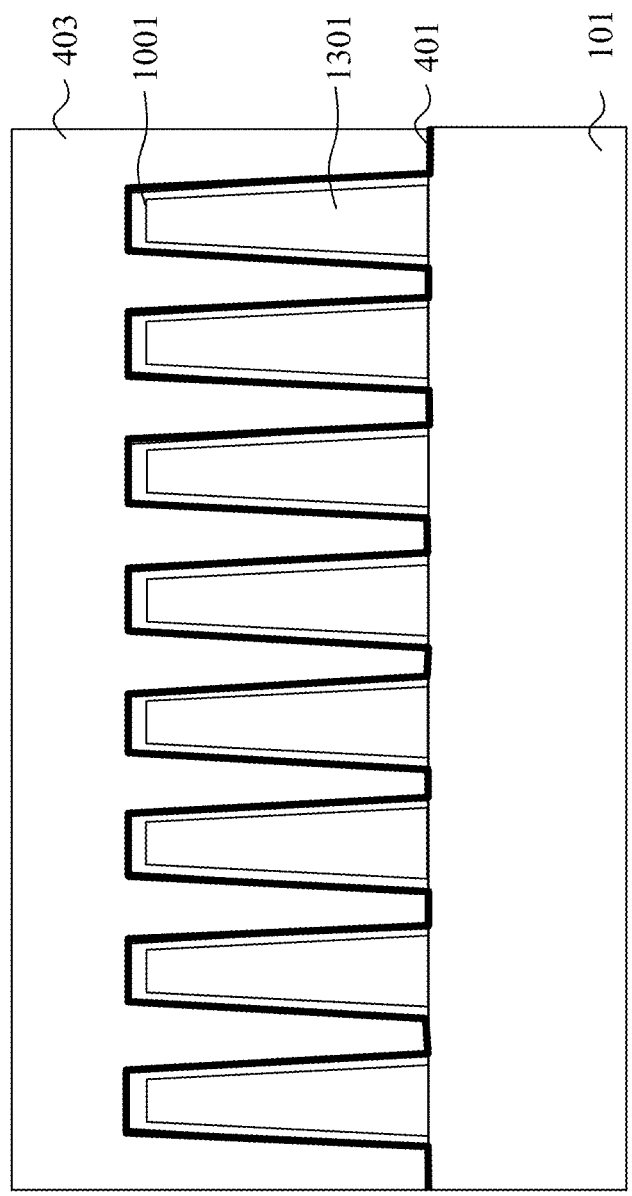

FIGS. 14A-14B illustrate a removal of the hard mask 603 and a formation of the second TMD layer 1001 along the outer perimeter of the sloped non-TMD fins 1301 (with FIG. 14B being a cross-section view of FIG. 14A along line B-B'). In an embodiment the second TMD layer 1001 may be formed as described above with respect to FIGS. 10A-10B. For example, the sloped non-TMD fins 1301 may be placed within the reaction chamber 107 and either TMD material may be directly deposited (in an embodiment in which the sloped non-TMD fins 1301 comprise silicon oxide or other dielectric) or else exposed surfaces of the sloped non-TMD fins 1301 may be reacted with the second precursor material 119 in order to form the second TMD layer 1001 (in an embodiment in which the sloped non-TMD fins 1301 comprise a TMD precursor such as molybdenum).

FIGS. 14A-14B also illustrate a formation of the gate dielectric 401 and the gate electrode 403 over the second TMD layer 1001 and the sloped non-TMD fins 1301. In an embodiment the gate dielectric 401 and the gate electrode 403 may be formed as described above with respect to FIGS. 4A-4B. However, the gate dielectric 401 and the gate electrode 403 may be formed in any suitable fashion. Additionally, while not specifically illustrated in FIGS. 14A-14B for clarity, other methods may be utilized to finish the device, such as by forming the source/drain regions 407 and forming the contact 501 in electrical connection with the second TMD layer 1001. In this embodiment the source/drain regions 407 may be formed as described above with respect to FIGS. 4A-4B and the contact 501 may be formed as described above with respect to FIGS. 5A-5B. For example, the ILD 503 may be initially deposited and then the contacts 501 may be formed within openings formed within the ILD 503 in order to make physical or electrical contact with the TMD sheets 701. However, any suitable methods may alternatively be utilized.

Figure 15:
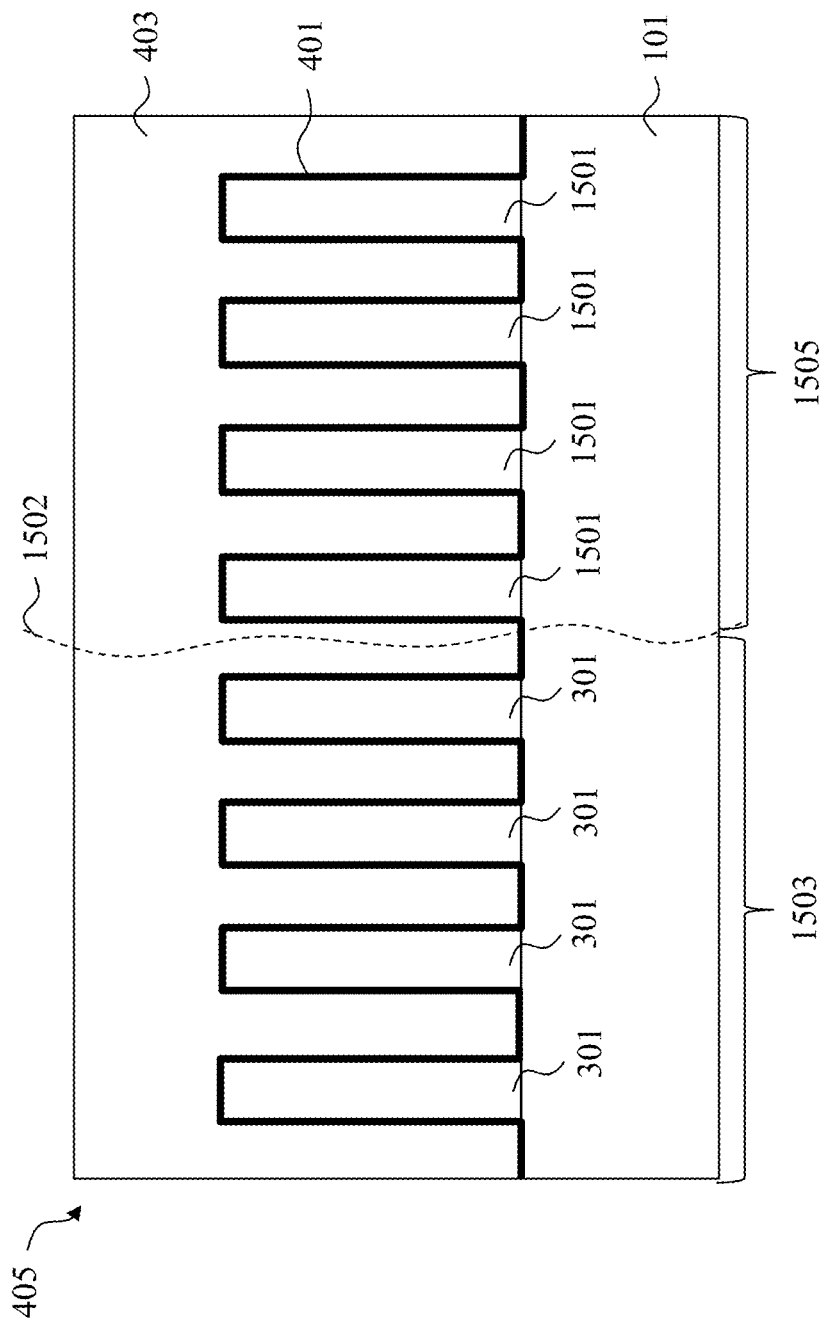
FIG. 15 illustrates a formation of third fins with the first fins, wherein the first fins and the third fins comprise different materials, in accordance with some embodiments.

FIG. 15 illustrate another embodiment in which third fins 1501 are formed on the substrate 101 with the fins 301, wherein the third fins 1501 comprise a different material than the fins 301. For example, in an embodiment in which the fins 301 comprise a TMD material such as $MoS_2$, the third fins 1501 may comprise a TMD material that is different from the fins 301 such as WS$_2$ or WSe$_2$. However, any suitable combination of different TMD materials may be utilized.

In a particular embodiment the fins may be formed in, e.g., an nMOSFET region 1503 of the substrate 101 without being formed within, e.g., a pMOSFET region 1505 of the substrate 101. The fins 301 may be formed as described above with respect to FIGS. 1A-14B. However, the materials chosen for the fins 301 (e.g., MoS$_2$) may be chosen based on the devices that will be made, such as by being materials tuned for nMOSFET devices.

Once the fins 301 have been formed, the fins 301 may be protected using, e.g., a photoresist or hard mask layer (not separately illustrated in FIG. 15) from further processing. Once protected, the third fins 1501 may be formed within the pMOSFET region 1505, which may be either adjacent to the nMOSFET region 1503 or separate from the nMOSFET region 1503 (as indicated by the dashed line 1502 in FIG. 15). In a particular embodiment in which the fins 301 are formed from MoS$_2$, the third fins 1501 may be formed from a TMD material such as WS or WSe$_2$, although any suitable combination of different TMD materials may be utilized. The TMD materials for the third fins 1501 may be formed as described above with respect to FIGS. 1A-14B, but with a different material than the fins 301.

By using different materials for different regions of the substrate 101, where different types of devices are utilized (e.g., pMOSFET and nMOSFET), the individual properties of the TMD materials may be chosen to provide the best desired performance from the individual devices. As such, the properties of the fins 301 and the properties of the third fins 1501 may be tuned as desired based on the device which will be made from the 301 and the third fins 1501.

FIG. 15 also illustrates a formation of the gate dielectric 401 and the gate electrode 403 over the fins 301 and the third fins 1501. In an embodiment the gate dielectric 401 and the gate electrode 403 may be formed as described above with respect to FIGS. 4A-4B. However, the gate dielectric 401 and the gate electrode 403 may be formed in any suitable fashion. Additionally, while not specifically illustrated in FIG. 15 for clarity, other methods may be utilized to finish the device, such as by forming the source/drain regions 407 within the fins 301 and the third fins 1501 and forming the contact 501 in electrical connection with the fins 301 and the third fins 1501. In this embodiment the source/drain regions 407 may be formed as described above with respect to FIGS. 4A-4B and the contact 501 may be formed as described above with respect to FIGS. 5A-5B. For example, the ILD 503 may be initially deposited and then the contacts 501 may be formed within openings formed within the ILD 503 in order to make physical or electrical contact with the fins 301 and the third fins 1501. However, any suitable methods may alternatively be utilized.

However, while the gate dielectric 401 and the gate electrode 403 are illustrated in FIG. 15 as extending over both the fins 301 and the third fins 1501, this is intended to be illustrative. In other embodiments, separate gate dielectrics 401 and gate electrodes 403 (not separately illustrated in FIG. 15) may be formed over the fins 301 in the nMOSFET region 1503 and over the third fins 1501 in the pMOSFET region 1505.

In accordance with an embodiment, a method of manufacturing a semiconductor device comprising depositing a transition metal dichalcogenide material onto a substrate and patterning the transition metal dichalcogenide material into one or more fins, wherein each one of the one or more fins has a top surface parallel with the substrate and a sidewall extending between the top surface and the substrate, is provided. A gate dielectric layer is deposited overlying the one or more fins and in physical contact with the top surface and the sidewall.

In accordance with another embodiment, a method of manufacturing a semiconductor device comprising depositing a non-transition metal dichalcogenide material onto a substrate and patterning the non-transition metal dichalcogenide material into a fin is provided. A transition metal dichalcogenide material is formed from the non-transition metal dichalcogenide material after the patterning the non-transition metal dichalcogenide material, and a gate dielectric and a gate electrode are deposited over the fin after the forming the transition metal dichalcogenide material.

In accordance with yet another embodiment, a semiconductor device comprising a first fin over a substrate, wherein the first fin comprises a top surface parallel with the substrate and a first transition metal dichalcogenide material located along a first sidewall of the fin is provided. A first gate dielectric is located over the top surface and adjacent to the first transition metal dichalcogenide material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first fin over a substrate, wherein opposite sidewalls of the first fin are sloped, wherein the first fin comprises:
a top surface parallel with the substrate;
a first transition metal dichalcogenide material extending from the top surface towards the substrate;
a first material immediately adjacent and in physical contact with the first transition metal dichalcogenide material, the first material extending from the top surface towards the substrate, wherein each chemical element within the first material is also within the first transition metal dichalcogenide material; and
a first gate dielectric adjacent to the first transition metal dichalcogenide material, wherein the first material of the fin is molybdenum and the first transition metal dichalcogenide material is MoS$_2$.

2. The semiconductor device of claim 1, further comprising a hard mask adjacent to the top surface of the first fin.

3. The semiconductor device of claim 1, further comprising a second transition metal dichalcogenide material extending from the top surface towards the substrate, the second transition metal dichalcogenide material being located on an opposite side of the first fin from the first transition metal dichalcogenide material.

4. The semiconductor device of claim 3, further comprising a third transition metal dichalcogenide material along the top surface of the first fin, the third transition metal dichalcogenide material connecting the first transition metal dichalcogenide material and the second transition metal dichalcogenide material.

5. The semiconductor device of claim 1, further comprising a second fin adjacent to the first fin, wherein the first gate dielectric extends over the second fin.

6. The semiconductor device of claim 5, further comprising a third fin adjacent to the second fin, wherein the first gate dielectric extends over the third fin.

7. A semiconductor device comprising:
  a first transition metal dichalcogenide material extending upwards from a substrate;
  a second transition metal dichalcogenide material extending upwards from the substrate, wherein the first transition metal dichalcogenide material and the second transition metal dichalcogenide material are opposite sidewalls of a fin, the fin comprising a first portion being a different material from the first transition metal dichalcogenide material and the second transition metal dichalcogenide material, the first portion of the fin comprising a precursor material of the second transition metal dichalcogenide material; and
  a gate dielectric adjacent to both the first transition metal dichalcogenide material and the second transition metal dichalcogenide material, wherein each of the opposite sidewalls of the fin is sloped, and wherein the first portion of the fin is molybdenum and the first transition metal dichalcogenide material is $MoS_2$.

8. The semiconductor device of claim 7, a third transition metal dichalcogenide material extending between the first transition metal dichalcogenide material and the second transition metal dichalcogenide material.

9. The semiconductor device of claim 8, wherein the third transition metal dichalcogenide material forms a top surface of the fin.

10. The semiconductor device of claim 8, wherein the third transition metal dichalcogenide material extends through a center of the fin.

11. The semiconductor device of claim 7, further comprising a second fin, the gate dielectric extending continuously over the second fin.

12. The semiconductor device of claim 7, further comprising a hard mask located between a portion of the gate dielectric and the fin.

13. A semiconductor device comprising:
  a first fin over a substrate, wherein the first fin comprises a top surface parallel with the substrate and a first transition metal dichalcogenide material located along a first sidewall of the first fin, wherein the first sidewall of the first fin and a second sidewall of the first fin are sloped; and
  a first gate dielectric located over the top surface and adjacent to the first transition metal dichalcogenide material, wherein the first transition metal dichalcogenide material comprises each chemical element within a first portion of the first fin, and wherein the first transition metal dichalcogenide material is $MoS_2$, and wherein the first portion of the first fin is molybdenum.

14. The semiconductor device of claim 13, further comprising a second transition metal dichalcogenide material along the second sidewall of the first fin.

15. The semiconductor device of claim 14, further comprising a third transition metal dichalcogenide material along the top surface of the first fin and connecting the first transition metal dichalcogenide material and the second transition metal dichalcogenide material.

16. The semiconductor device of claim 13, further comprising a second fin adjacent to the first fin, wherein the first gate dielectric extends over the second fin.

17. The semiconductor device of claim 16, further comprising a second gate dielectric extending over the first fin and the second fin.

18. The semiconductor device of claim 2, wherein the hard mask comprises silicon nitride.

19. The semiconductor device of claim 12, wherein the hard mask comprises silicon carbide.

20. The semiconductor device of claim 13, further comprising a hard mask over the first fin, the hard mask comprising an oxynitride.

* * * * *